(12) United States Patent
Honda

(10) Patent No.: US 7,749,825 B2
(45) Date of Patent: Jul. 6, 2010

(54) FORMING A THIN TRANSISTOR WITH A REDUNDANT SOURCE OF DRAIN ELECTRODE

(75) Inventor: Tatsuya Honda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 29 days.

(21) Appl. No.: 11/545,223

(22) Filed: Oct. 10, 2006

(65) Prior Publication Data

US 2007/0087487 A1 Apr. 19, 2007

(30) Foreign Application Priority Data

Oct. 14, 2005 (JP) .............................. 2005-300825

(51) Int. Cl.
*H01L 21/84* (2006.01)
(52) U.S. Cl. .............................. 438/158; 257/E51.005; 257/E51.006; 257/E29.151; 438/161
(58) Field of Classification Search ................. 438/149, 438/355, 158–159, 161, 164, 165; 257/E29.111, 257/E29.112, E29.117, E29.122, E51.005, 257/E29.151, E21.005
See application file for complete search history.

(56) References Cited

U.S. PATENT DOCUMENTS

| 4,381,213 | A | * | 4/1983 | Flowers et al. ............... | 438/558 |
| 5,561,075 | A | | 10/1996 | Nakazawa | |
| 5,648,662 | A | | 7/1997 | Zhang et al. | |
| 6,403,408 | B1 | * | 6/2002 | Green et al. ................. | 438/161 |
| 6,933,213 | B2 | * | 8/2005 | Lee ............................ | 438/478 |
| 2001/0052466 | A1 | * | 12/2001 | Horii ........................... | 205/122 |
| 2003/0218166 | A1 | | 11/2003 | Tsutsui | |

(Continued)

FOREIGN PATENT DOCUMENTS

JP 61-51188 3/1986

(Continued)

OTHER PUBLICATIONS

The American Heritage Dictionary of the English Language, Fourth Edition. Houghton Mifflin Company, 2004. http://dictionary.reference.com/browse/contact (accessed: Jan. 2, 2008).*

(Continued)

*Primary Examiner*—Hsien-ming Lee
*Assistant Examiner*—Kevin Parendo
(74) *Attorney, Agent, or Firm*—Husch Blackwell Sanders LLP

(57) ABSTRACT

An object is to obtain a semiconductor device with improved characteristics by reducing contact resistance of a semiconductor film with electrodes or wirings, and improving coverage of the semiconductor film and the electrodes or wirings. The present invention relates to a semiconductor device including a gate electrode over a substrate, a gate insulating film over the gate electrode, a first source or drain electrode over the gate insulating film, an island-shaped semiconductor film over the first source or drain electrode, and a second source or drain electrode over the island-shaped semiconductor film and the first source or drain electrode. Further, the second source or drain electrode is in contact with the first source or drain electrode, and the island-shaped semiconductor film is sandwiched between the first source or drain electrode and the second source or drain electrode. Moreover, the present invention relates to a manufacturing method of the semiconductor device.

25 Claims, 24 Drawing Sheets

U.S. PATENT DOCUMENTS

| | | | |
|---|---|---|---|
| 2004/0183970 A1* | 9/2004 | Niiya | 349/114 |
| 2005/0014319 A1* | 1/2005 | Yamazaki et al. | 438/197 |
| 2005/0139823 A1 | 6/2005 | Hirakata et al. | |
| 2005/0173701 A1* | 8/2005 | Kawase et al. | 257/40 |

FOREIGN PATENT DOCUMENTS

| | | |
|---|---|---|
| JP | 2005-223048 | 8/2005 |

OTHER PUBLICATIONS

International Search Report re application No. PCT/JP2006/320154, dated Jan. 9, 2007.

Written Opinion re application No. PCT/JP2006/320154, dated Jan. 9, 2007.

* cited by examiner 101  103  102  105  104  106

1001  1003  1002  1004  1005

1011  1013  1012  1015  1014

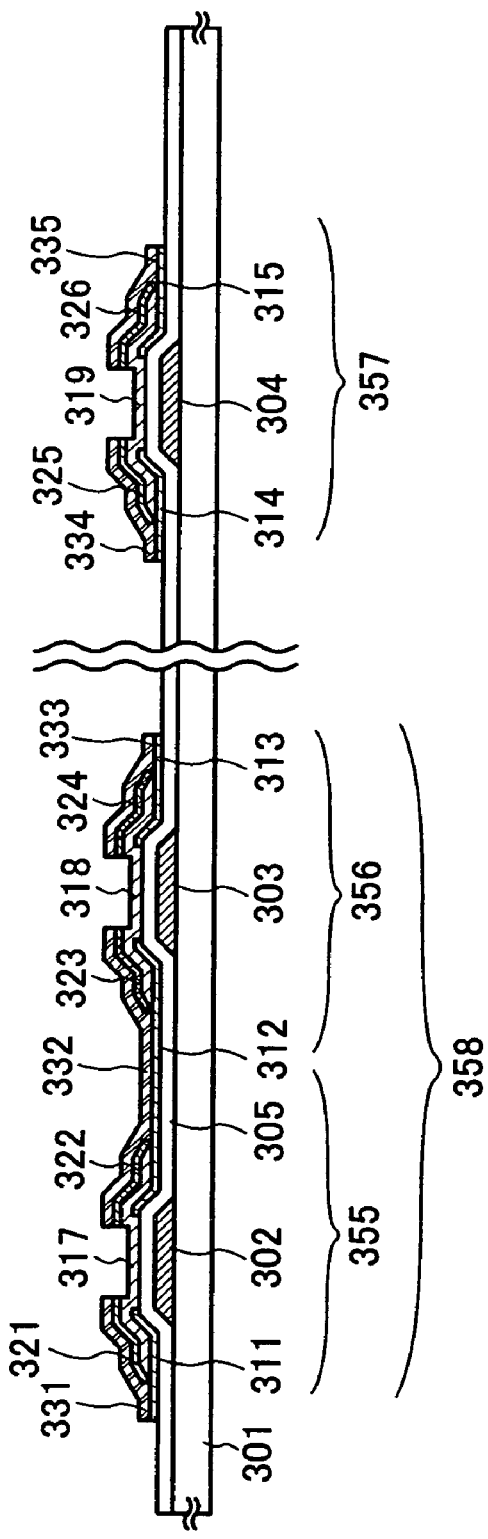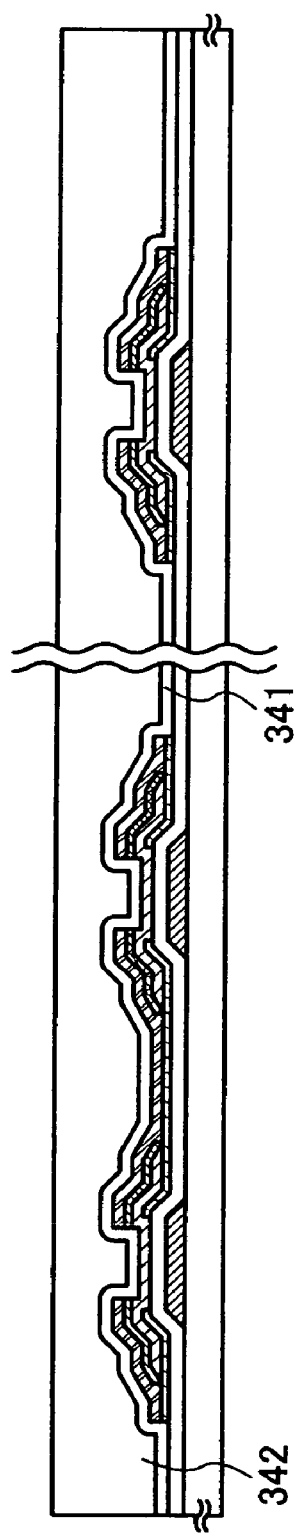
FIG. 7A
FIG. 7B

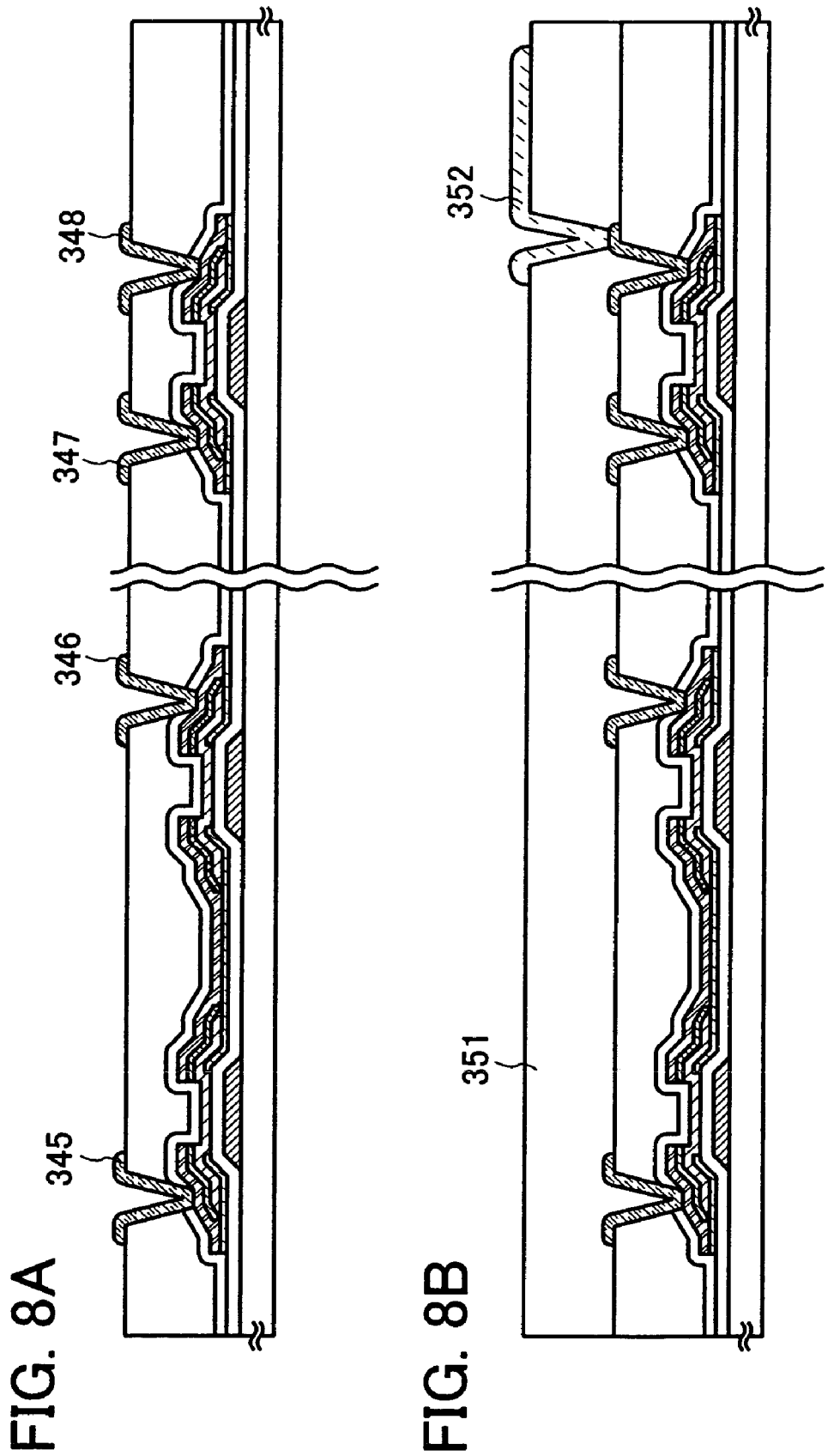

381  371

367

361

FIG. 15A
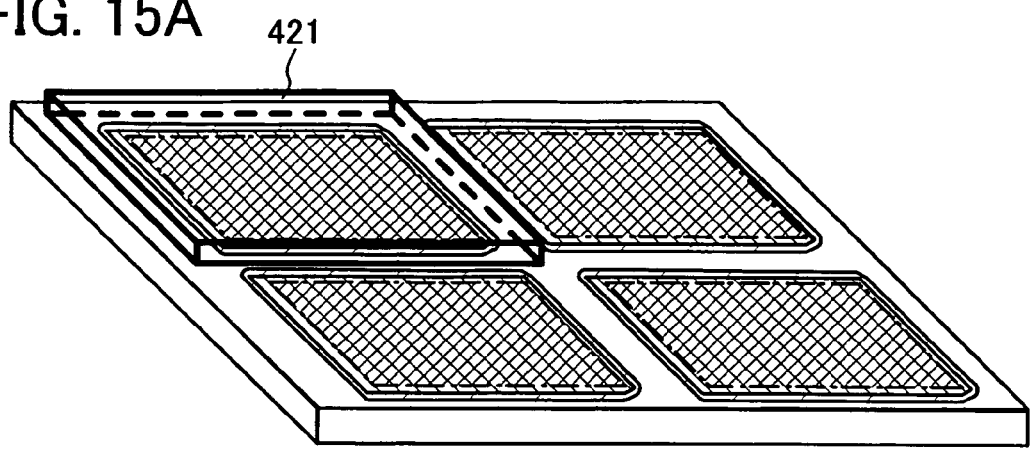
FIG. 15B
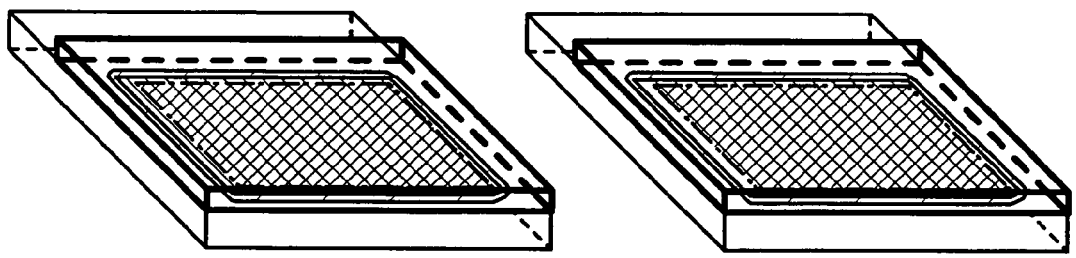
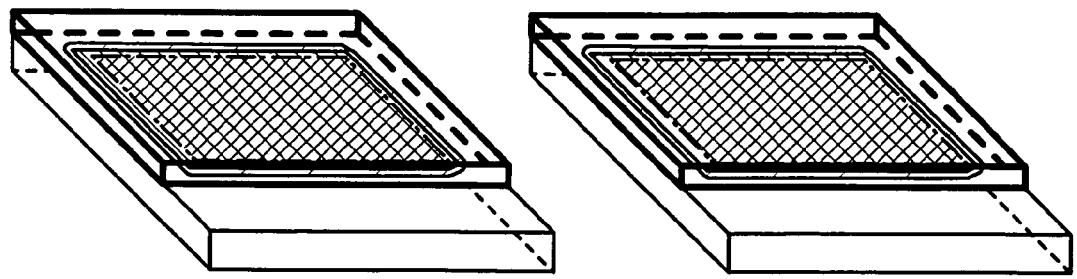

FORMING A THIN TRANSISTOR WITH A REDUNDANT SOURCE OF DRAIN ELECTRODE

TECHNICAL FIELD

The present invention relates to a semiconductor device and a manufacturing method thereof.

BACKGROUND ART

In recent years, development of thin film transistors (TFT) that can be formed over flexible plastic substrates or paper substrates has been actively pursued in order to realize sheet displays, sheet computers, and the like. Consequently, it is an important challenge to respond to a demand that a TFT be able to be manufactured at a temperature that is equal to or lower than an allowable temperature limit of a substrate.

However, manufacturing the TFT at a temperature that is equal to or lower than the allowable temperature limit of the substrate means that heating at high temperature cannot be performed, and this causes problems. For example, a problem occurs in which an on current and mobility which are TFT characteristics are degraded due to insufficient contact between a wiring and a semiconductor film.

As an example of a pixel TFT provided for a display device, there is a bottom gate TFT in which a gate electrode is positioned under a semiconductor layer and a gate insulating film. Further, among bottom gate TFTs, there is a top contact type in which a source electrode and a drain electrode are positioned over the semiconductor layer (see FIG. 2A), as well as a bottom contact type in which the source electrode and the drain electrode are positioned under the semiconductor layer (see FIG. 2B) (refer to Patent Document 1: Japanese Published Patent Application No. 2005-223048).

A top contact type bottom gate TFT shown in FIG. 2A includes a gate electrode 1002 over a substrate 1001, a gate insulating film 1003 over the gate electrode 1002, and a semiconductor film 1004 over the gate insulating film 1003. Further, electrodes 1005 each functioning as a source electrode or drain electrode (hereinafter referred to as source or drain electrodes 1005. Note that in this specification, "source or drain electrodes" mean that each of the electrodes may function as a source electrode or a drain electrode) are formed over the semiconductor film 1004. When voltage is applied to the gate electrode 1002, a source region or a drain region is formed in each of regions of the semiconductor film 1004 that are in contact with the source or drain electrodes 1005, and a channel forming region is formed in the semiconductor film 1004 above the gate electrode 1002 and between the source region and the drain region.

A bottom contact type bottom gate TFT shown in FIG. 2B includes a gate electrode 1012 over a substrate 1011, a gate insulating film 1013 over the gate electrode 1012, and source or drain electrodes 1014 over the gate insulating film 1013. Further, the bottom contact type bottom gate TFT includes a semiconductor film 1015 over the gate insulating film 1013 and the source or drain electrodes 1014. When voltage is applied to the gate electrode 1012, a source region or a drain region is formed in each of regions of the semiconductor film 1015 that are in contact with the source or drain electrodes 1014, and a channel forming region is formed in the semiconductor film 1015 above the gate electrode 1012 and between the source region and the drain region.

In a top contact type bottom gate TFT (FIG. 2A) and in a bottom contact type bottom gate TFT (FIG. 2B) in which the source electrode and the drain electrode are positioned under the semiconductor layer, contact between the semiconductor film and electrodes or wirings is poor if a heat treatment is not sufficiently performed, and an on current and mobility are degraded. Therefore, a heat treatment at around 300° C. is usually performed. However, when a substrate is made of a material with a low allowable temperature limit instead of a material with a high allowable temperature limit, such as plastic or paper, the heat treatment cannot be performed at such a temperature.

Further, although it is necessary that film thicknesses of electrodes or wirings are thick in order to lower wiring resistance, in the bottom contact type bottom gate TFT shown in FIG. 2B, there is concern that coverage of the semiconductor film and the source or drain electrodes becomes poor. Consequently, degradation in TFT characteristics occurs.

DISCLOSURE OF INVENTION

An object of the present invention is to obtain a semiconductor device with improved characteristics by reducing contact resistance between a semiconductor film and electrodes or wirings and improving coverage of the semiconductor film and the electrodes or wirings.

In a semiconductor device of the present invention, in order to reduce contact resistance between a semiconductor film and electrodes or wirings, source or drain electrodes are formed over and under the semiconductor film.

Further, in order to improve coverage of the semiconductor film and the electrodes, thicknesses of first source or drain electrodes that are formed under the semiconductor film is to be thinner than that of second source or drain electrodes that are formed over the semiconductor film.

Note that in this specification, a semiconductor device refers to devices in general which function by utilizing a semiconductor characteristic, and semiconductor circuits, electro-optical devices and electronic devices including a semiconductor layer are all semiconductor devices.

The present invention relates to a semiconductor device including a gate electrode over a substrate, a gate insulating film over the gate electrode, first source or drain electrodes over the gate insulating film, an island-shaped semiconductor film over the first source or drain electrodes, and second source or drain electrodes over the island-shaped semiconductor film and the first source or drain electrodes. The second source or drain electrodes are in contact with the first source or drain electrodes, and the island-shaped semiconductor film is sandwiched between the first source or drain electrodes and the second source or drain electrodes.

The present invention relates to a semiconductor device including a gate electrode over a substrate, a gate insulating film over the gate electrode, first source or drain electrodes over the gate insulating film, an island-shaped semiconductor film over the first source or drain electrodes, an island-shaped impurity semiconductor film added with an impurity imparting one conductivity type over the island-shaped semiconductor film, and second source or drain electrodes over the island-shaped semiconductor film, the island-shaped impurity semiconductor film and the first source or drain electrodes. The second source or drain electrodes are in contact with the first source or drain electrodes, and the island-shaped semiconductor film and the island-shaped impurity semiconductor film are sandwiched between the first source or drain electrodes and the second source or drain electrodes.

The present invention relates to a manufacturing method of a semiconductor device in which a gate electrode is formed over a substrate, a gate insulating film is formed over the gate electrode, first source or drain electrodes are formed over the gate insulating film, an island-shaped semiconductor film is formed over the first source or drain electrodes, and second source or drain electrodes are formed over the first source or drain electrodes and the island-shaped semiconductor film. The second source or drain electrodes are in contact with the first source or drain electrodes, and the island-shaped semiconductor film is sandwiched between the first source or drain electrodes and the second source or drain electrodes.

In the present invention, at least one of the gate electrode, the gate insulating film, the first source or drain electrodes, the island-shaped semiconductor film, an island-shaped impurity semiconductor film added with an impurity imparting one conductivity type described below, and the second source or drain electrodes is formed by an ink-jet method.

The present invention relates to a manufacturing method of a semiconductor device in which a first conductive film is formed over a substrate, a gate electrode is formed using the first conductive film, a gate insulating film is formed over the gate electrode, a second conductive film is formed over the gate insulating film, first source or drain electrodes are formed using the second conductive film, a semiconductor film is formed over the first source or drain electrodes, an island-shaped semiconductor film is formed using the semiconductor film, a third conductive film is formed over the first source or drain electrodes and the island-shaped semiconductor film, and second source or drain electrodes are formed using the third conductive film. The second source or drain electrodes are in contact with the first source or drain electrodes, and the island-shaped semiconductor film is sandwiched between the first source or drain electrodes and the second source or drain electrodes.

The present invention relates to a manufacturing method of a semiconductor device in which a gate electrode is formed over a substrate, a gate insulating film is formed over the gate electrode, first source or drain electrodes are formed over the gate insulating film, an island-shaped semiconductor film is formed over the first source or drain electrodes, an island-shaped impurity semiconductor film added with an impurity imparting one conductivity type over the island-shaped semiconductor film, and second source or drain electrodes are formed over the first source or drain electrodes, the island-shaped semiconductor film and the island-shaped impurity semiconductor film. The second source or drain electrodes are in contact with the first source or drain electrodes, and the island-shaped semiconductor film and the island-shaped impurity semiconductor film are sandwiched between the first source or drain electrodes and the second source or drain electrodes.

In the present invention, the impurity imparting one conductivity type is phosphorus or arsenic.

In the present invention, the impurity imparting one conductivity type is boron.

A source region and a drain region of a semiconductor device of the present invention each have a structure of being sandwiched from above and below by source or drain electrodes; therefore, contact resistance of the source or drain electrodes and a semiconductor film can be reduced. Also, since there are two layers of the source or drain electrodes, wiring resistance can also be reduced. Further, since first source or drain electrodes that are formed under the semiconductor film can be formed to be thin, coverage of the semiconductor film can be improved to improve TFT characteristics. Consequently, reliability of a semiconductor device of the present invention can also be improved.

BRIEF DESCRIPTION OF DRAWINGS

In the accompanying drawings:

FIGS. 7A and 7B each show a manufacturing step of a liquid crystal display device of the present invention;

FIGS. 8A and 8B each show a manufacturing step of a liquid crystal display device of the present invention;

FIGS. 15A and 15B each show a manufacturing step of a liquid crystal display device using a liquid crystal dropping method of the present invention;

BEST MODE FOR CARRYING OUT THE INVENTION

In this embodiment mode, a structure of a semiconductor device of the present invention and a manufacturing method thereof are described with reference to FIG. 1 and FIGS. 3A to 3D.

Figure 1:
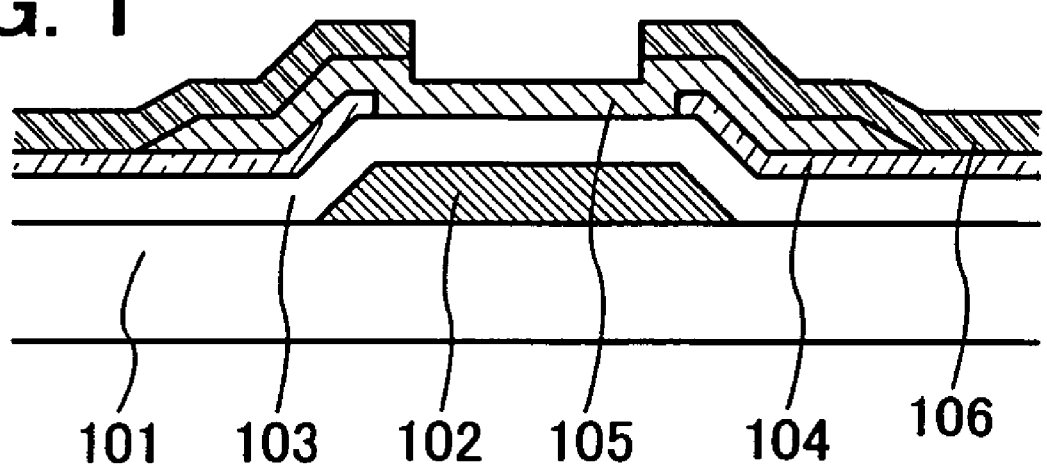
FIG. 1 shows a cross-sectional view of a semiconductor device of the present invention.
Figure 2A:
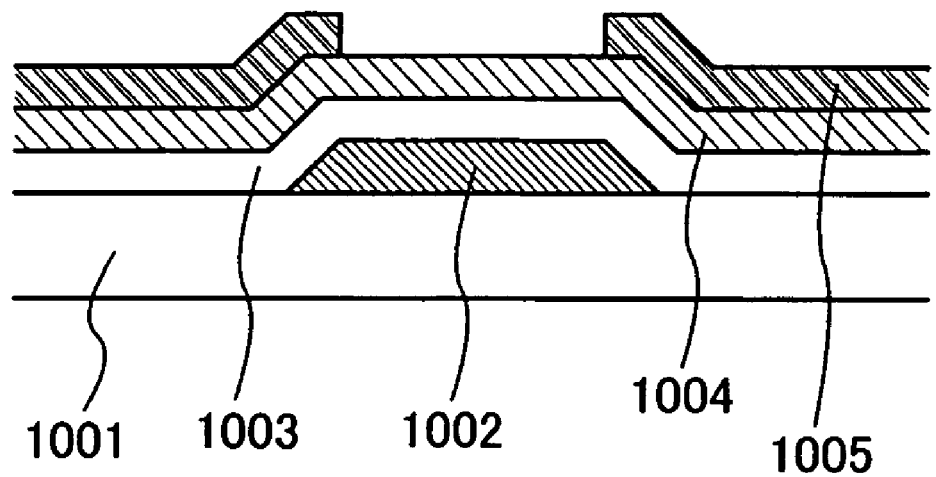
FIGS. 2A and 2B each show a cross-sectional view of a conventional semiconductor device.
Figure 2B:
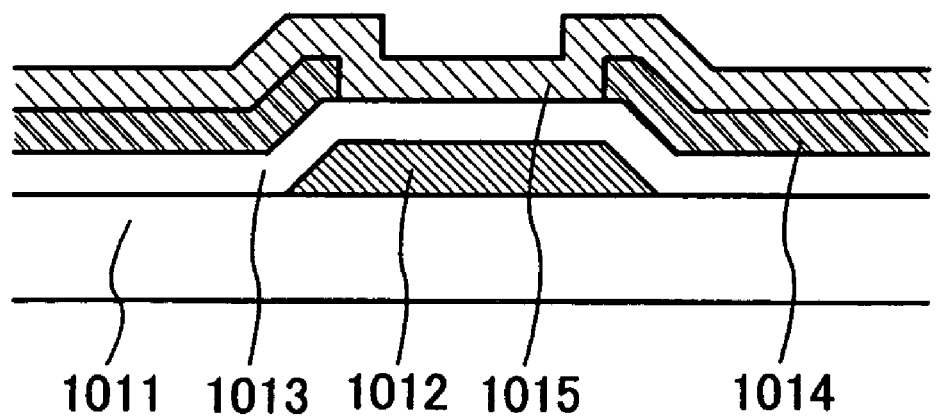
Figure 3A:
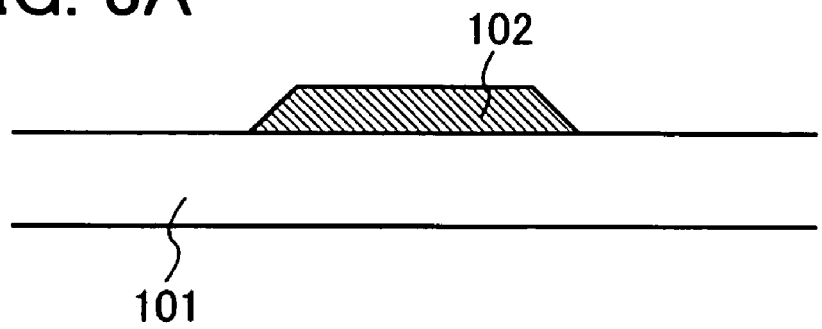
FIGS. 3A to 3D each show a manufacturing step of a semiconductor device of the present invention.

First, a gate electrode 102 is formed over a substrate 101 (see FIG. 3A). In this embodiment mode, a glass substrate is used as the substrate 101, and the gate electrode 102 is formed over the glass substrate using a tungsten film.

Although glass is used for the substrate 101 in this embodiment mode, as a substrate with low heat resistance, plastic, paper to which a planarization treatment is performed on surfaces thereof, papers to which a plastic treatment is performed on surfaces thereof, and the like can be used, besides glass. Also, to form the gate electrode 102, a single layer film such as a polycrystalline silicon (poly-Si) film, an aluminum (Al) film, a titanium (Ti) film, a tantalum (Ta) film, or a molybdenum (Mo) film; or a stacked layer film that is a combination thereof can be used besides the tungsten (W) film.

Figure 3B:
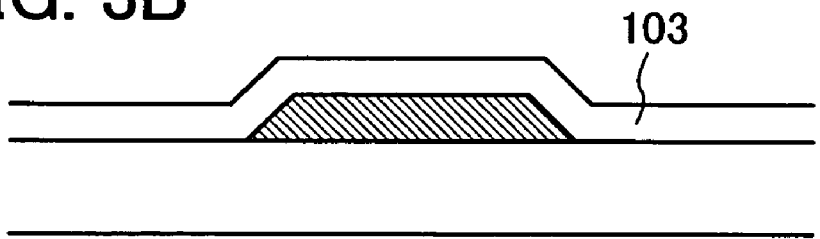

Subsequently, a gate insulating film 103 is formed over the gate electrode 102 (see FIG. 3B). In this embodiment mode, a silicon oxide film containing nitrogen is used as the gate insulating film 103.

As the gate insulating film 103, a single layer film such as a silicon oxide film, a silicon nitride film, or an aluminum oxide film; or a stacked layer film that is a combination thereof can be used besides the silicon oxide film containing nitrogen.

Figure 3C:
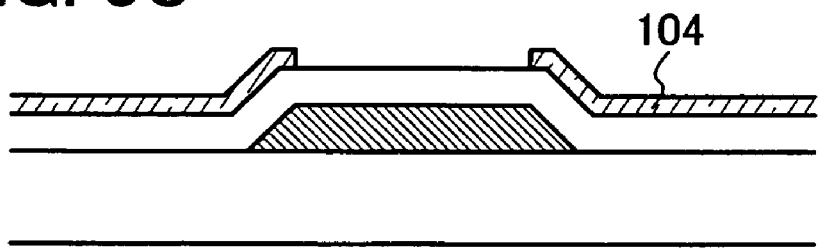

Next, first source or drain electrodes 104 are formed over the gate insulating film 103 (see FIG. 3C). In this embodiment mode, a titanium film is used as the first source or drain electrodes 104. A titanium film can reduce the difference in contact potential between the first source or drain electrodes 104 and an island-shaped semiconductor film 105. Also, by forming the first source or drain electrodes 104 to be thin, coverage by the island-shaped semiconductor film 105 that is subsequently formed can be improved.

Note that the same material as that of the gate electrode 102 can be used for the first source or drain electrodes 104. That is, as the first source or drain electrodes 104, a single layer film such as a tungsten film, a polycrystalline silicon film, an aluminum film, a tantalum film, or a molybdenum film; or a stacked layer film that is a combination thereof can be used besides the titanium film.

Figure 3D:
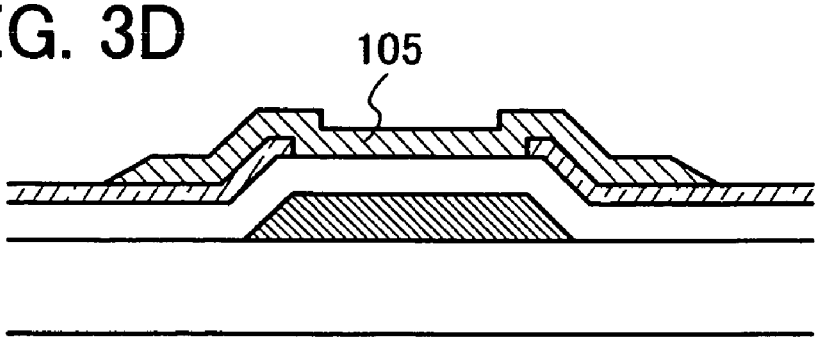

The island-shaped semiconductor film 105, for example a zinc oxide (ZnO) film is formed over the first source or drain electrodes 104 (see FIG. 3D).

As the island-shaped semiconductor film 105, an inorganic semiconductor film such as a silicon (Si) film, a silicon germanium (SiGe) film, a gallium arsenic (GaAs) film, a gallium nitride (GaN) film, an indium oxide ($InO_x$) film, a tin oxide ($SnO_2$) film, an indium phosphorus (InP) film, an indium nitride (InN) film, a cadmium sulfide (CdS) film, or a cadmium telluride (CdTe) film; or an organic semiconductor film such as a pentacene film, or an oligothiophene film can be used other then the zinc oxide film.

Next, second source or drain electrodes 106 are formed over the island-shaped semiconductor film 105. Although a stacked layer film of an aluminum film and a titanium film is formed as the second source or drain electrodes 106 in this embodiment mode, a similar material to those of the gate electrode 102 and the first source or drain electrodes 104 may be used to form the second source or drain electrodes 106. That is, as the second source or drain electrodes 106, a single layer film such as a titanium film, a tungsten film, a polycrystalline silicon film, an aluminum film, a tantalum film, or a molybdenum film can be used besides the stacked layer film of an aluminum film and a titanium film; or a stacked layer film that is a combination thereof can be used, except for the combination of an aluminum film and a titanium film.

In the present invention, thicknesses of the first source or drain electrodes 104 that are formed under the island-shaped semiconductor film 105 can be thinner than thicknesses of the second source or drain electrodes 106 that are formed over the island-shaped semiconductor film 105.

By making the thickness of the first source or drain electrodes 104 thin, coverage of the island-shaped semiconductor film 105 can be favorable.

Further, by making the coatability of the island-shaped semiconductor film 105 favorable, TFT characteristics can be improved since a crack in a step portion and distortion due to stress concentration can be suppressed.

Also, the thickness of the first source or drain electrodes 104 can be formed to be a thickness that is half of that of the island-shaped semiconductor film 105 to a thickness that is the same as that of the island-shaped semiconductor film 105.

The second source or drain electrodes 106 are in contact with the first source or drain electrodes 104, and they each form a source electrode or a drain electrode. Also, regions in the island-shaped semiconductor film each serving as a source region or a drain region are sandwiched between the first source or drain electrodes 104 and the second source or drain electrodes 106.

In the formation of the second source or drain electrodes 106, the same mask as the mask used to etch the first source or drain electrodes 104 can be used to etch the second source or drain electrodes 106. Consequently, the number of masks is not increased.

Also, by sandwiching the regions in the island-shaped semiconductor film 105 each serving as a source region or drain region between the first source or drain electrodes 104 and the second source or drain electrodes 106, contact resistance between the regions each serving as a source region or drain region and wirings can be reduced and the thickness of the second source or drain electrodes 106 can be formed to be thick; consequently wiring resistance can be reduced as well.

In this manner, the source region and the drain region of the semiconductor device of this embodiment mode each have a structure of being sandwiched from above and below by the source or drain electrodes; therefore, contact resistance of the source or drain electrodes and the semiconductor film can be reduced. Also, since there are two layers of the source or drain electrodes, wiring resistance can also be reduced. Further, since the first source or drain electrodes that are formed under the semiconductor film can be formed to be thin, coverage of the semiconductor film can be improved to improve TFT characteristics, and reliability of the TFT can also be improved.

Embodiment 1

In this embodiment, a semiconductor device of the present invention and a manufacturing method thereof are described with reference to FIG. 1, and FIGS. 23A to 24B.

Figure 23A:
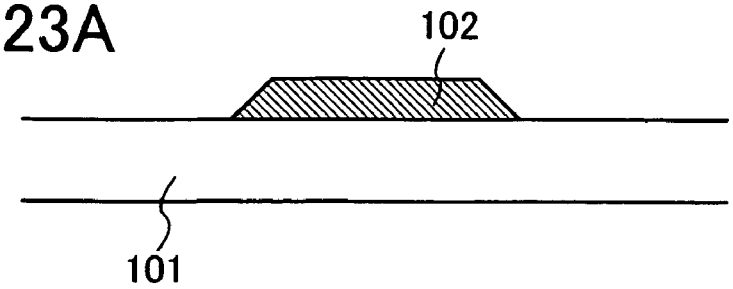
FIGS. 23A to 23E each show a manufacturing step of a semiconductor device of the present invention.

First, a first conductive film is formed over the substrate 101, and the gate electrode 102 is formed using the first conductive film (see FIG. 23A). In this embodiment, a glass substrate is used as the substrate 101, and a tungsten film is formed over the glass substrate so as to have a thickness of 100 nm to 200 nm, for example 150 nm, using a sputtering apparatus. Then, a resist serving as an etching mask is formed over the tungsten film using a light exposure apparatus, an inkjet apparatus, or the like. Subsequently, the tungsten film is etched using a dry etching apparatus to form the gate electrode 102.

Although glass is used for the substrate 101 in this embodiment, as a substrate with low heat resistance, plastic, paper, or the like can be used, besides glass. Also, as the first conductive film for forming the gate electrode 102, a single layer film of a polycrystalline silicon (poly-Si) film, an aluminum (Al) film, a titanium (Ti) film, a tantalum (Ta) film, a molybdenum (Mo) film, or the like; or a stacked layer film that is a combination thereof can be used besides the tungsten (W) film.

Figure 23B:
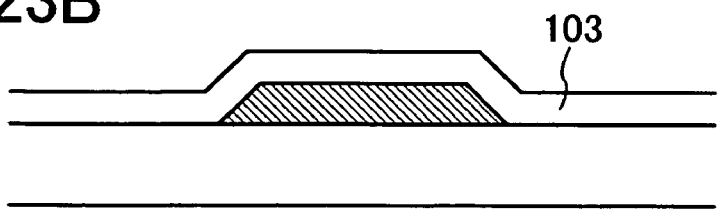
Figure 23C:
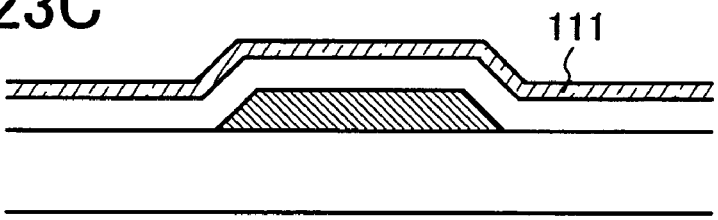

Subsequently, the gate insulating film 103 is formed over the gate electrode 102 (see FIG. 23B). In this embodiment, as the gate insulating film 103, a silicon oxide film containing nitrogen is formed to have a thickness of 50 nm to 200 nm, for example 100 nm, using a CVD apparatus or the like.

As the gate insulating film 103, a single layer film of a silicon oxide film, a silicon nitride film, an aluminum oxide film, or the like; or a stacked layer film that is a combination thereof can be used, besides the silicon oxide film containing nitrogen.

Figure 23D:
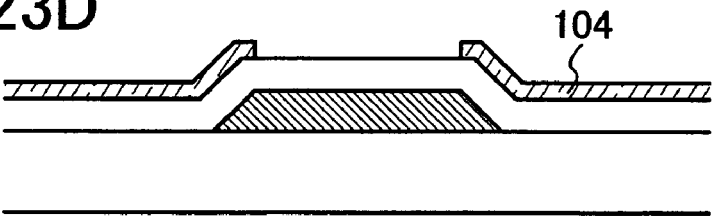

Next, a second conductive film 111 is formed over the gate insulating film 103 (see FIG. 23C), and the first source or drain electrodes 104 are formed using the second conductive film 111 (see FIG. 23D). In this embodiment, as the second conductive film 111, a titanium film is formed to have a thickness of 50 nm to 100 nm, for example 50 nm, using a sputtering apparatus. When a titanium film is used, the difference in contact potential between the second conductive film 111 and the semiconductor film 112 can be reduced. Also, by making a thickness of the second conductive film 111 to be a thickness that is about half of that of the semiconductor film 112 to a thickness that is about the same as that of the semiconductor film 112 (50 nm in this embodiment), coverage by the semiconductor film 112 that is subsequently formed can be favorable. Then, a resist serving as an etching mask is formed using a light exposure apparatus, an inkjet apparatus, or the like, and then etching is performed using a dry etching apparatus to form the first source or drain electrodes 104.

Note that for the second conductive film 111, the same material as that of the first conductive film can be used. That is, as the second conductive film 111, a single layer film such as a tungsten film, a polycrystalline silicon film, an aluminum film, a tantalum film, or a molybdenum film; or a stacked layer film that is a combination thereof can be used besides the titanium film.

Figure 23E:
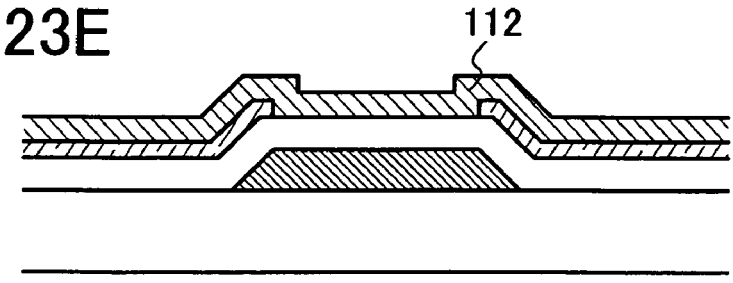

As the semiconductor film 112, a zinc oxide (ZnO) film for example is formed over the first source or drain electrodes 104 so as to have a thickness of 50 nm to 200 nm, for example 100 nm, by a sputtering method (see FIG. 23E). As described above, it is favorable that the thickness of the semiconductor film 112 is a thickness that is about the same as that of the first source or drain electrodes 104 to a thickness that is about twice that of the first source or drain electrodes 104. Subsequently, a resist is formed using a light exposure apparatus, an inkjet apparatus, or the like, and the island-shaped semiconductor film 105 is formed using a dry etching apparatus or by wet etching using a hydrofluoric acid aqueous solution or the like (see FIG. 24A).

As the semiconductor film 112, an inorganic semiconductor film such as a silicon (Si) film, a silicon germanium (SiGe) film, a gallium arsenic (GaAs) film, a gallium nitride (GaN) film, an indium oxide ($InO_x$) film, a tin oxide ($SnO_2$) film, an indium phosphorus (InP) film, an indium nitride (InN) film, a cadmium sulfide (CdS) film, or a cadmium telluride (CdTe) film; or an organic semiconductor film such as a pentacene film or an oligothiophene film can be used other than the zinc oxide film. Note that, if necessary, the semiconductor film 112 may be doped with phosphorus (P), arsenic (As) or the like which is an impurity imparting n-type conductivity. Also, the semiconductor film may be doped with boron (B) or the like which is an impurity imparting p-type impurity, if necessary.

Figure 24A:
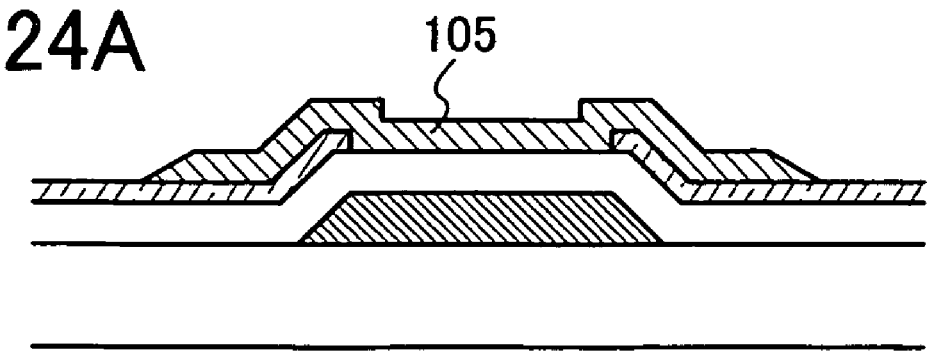
FIGS. 24A and 24B each show a manufacturing step of a semiconductor device of the present invention.
Figure 24B:
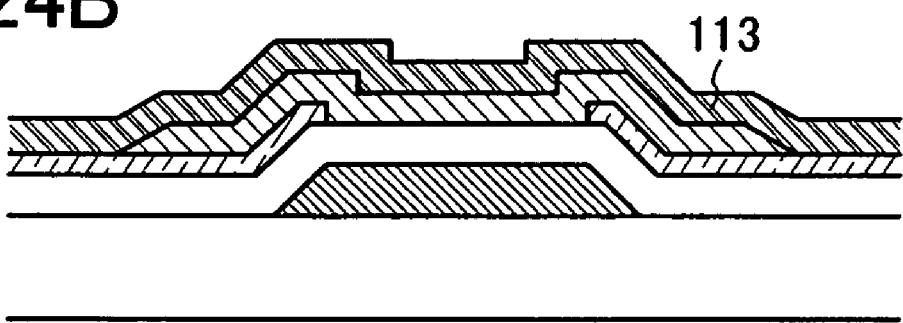

Subsequently, a third conductive film 113 is formed over the island-shaped semiconductor film 105 (see FIG. 24B). In this embodiment, a stacked layer film of an aluminum film and a titanium film is formed as the third conductive film 113. A thickness of the aluminum film is 100 nm to 300 nm, for example, 150 nm, and a thickness of the titanium film is 50 nm to 100 nm, for example 50 nm. Then, a resist serving as an etching mask is formed using a light exposure apparatus, an inkjet apparatus, or the like, and the second source or drain electrodes 106 are formed using a dry etching apparatus (see FIG. 1).

Even if the thickness of the first source or drain electrodes 104 is thin, the thickness of the second source or drain electrodes 106 can be formed to be thick; therefore, contact resistance of the source or drain electrodes as a whole can be reduced.

The second source or drain electrodes 106 are in contact with the first source or drain electrodes 104, and they each form a source electrode or drain electrode. Also, regions in the island-shaped semiconductor film 105 each serving as a source region or a drain region are sandwiched between the first source or drain electrodes 104 and the second source or drain electrodes 106.

Note that the third conductive film 113 can be formed using a similar material to that of the first conductive film and the second conductive film 111. That is, as the third conductive film 113, a single layer film such as a titanium film, a tungsten film, a polycrystalline silicon film, an aluminum film, a tantalum film, or a molybdenum film can be used besides the stacked layer film of an aluminum film and a titanium film; or a stacked layer film that is a combination thereof can be used, except for the combination of an aluminum film and a titanium film.

In the formation of the second source or drain electrodes 106, the same mask as the mask used to etch the first source or drain electrodes 104 can be used to etch the second source or drain electrodes 106. Consequently, the number of masks is not increased.

Also, by sandwiching the regions in the island-shaped semiconductor film 105 each serving as a source region or drain region between the first source or drain electrodes 104 and the second source or drain electrodes 106, contact resistance between the regions each serving as a source region or drain region and wirings can be reduced and the thickness of the second source or drain electrodes 106 can be formed to be thick; consequently, wiring resistance can be reduced as well.

Embodiment 2

In this embodiment, a result of calculating a transistor characteristic of a TFT of the present invention is described with reference to FIG. 4. Note that a structure of the TFT calculated in this embodiment is equivalent to that shown in FIG. 1. Various conditions set in this embodiment are listed below.

Length between the source electrode and the drain electrode (channel length) L: 3 μm Width of each of the source electrode and the drain electrode (channel width) W: 1 μm Semiconductor layer: silicon (Si) film Thickness of the semiconductor layer: 100 nm Impurity contained in the semiconductor layer: phosphorus (P)

Density of the impurity contained in the semiconductor layer: $1 \times 10^{15}$ cm$^{-3}$ Gate insulating film: silicon oxide film Thickness of the gate insulating film: 100 nm For the calculation, a device simulator by Integrated Systems Engineering (ISE) is used. For a physical model, an electrical field effect is considered for mobility, and silicon which is the semiconductor film is assumed to be ideal crystals without a defect.

Figure 4:
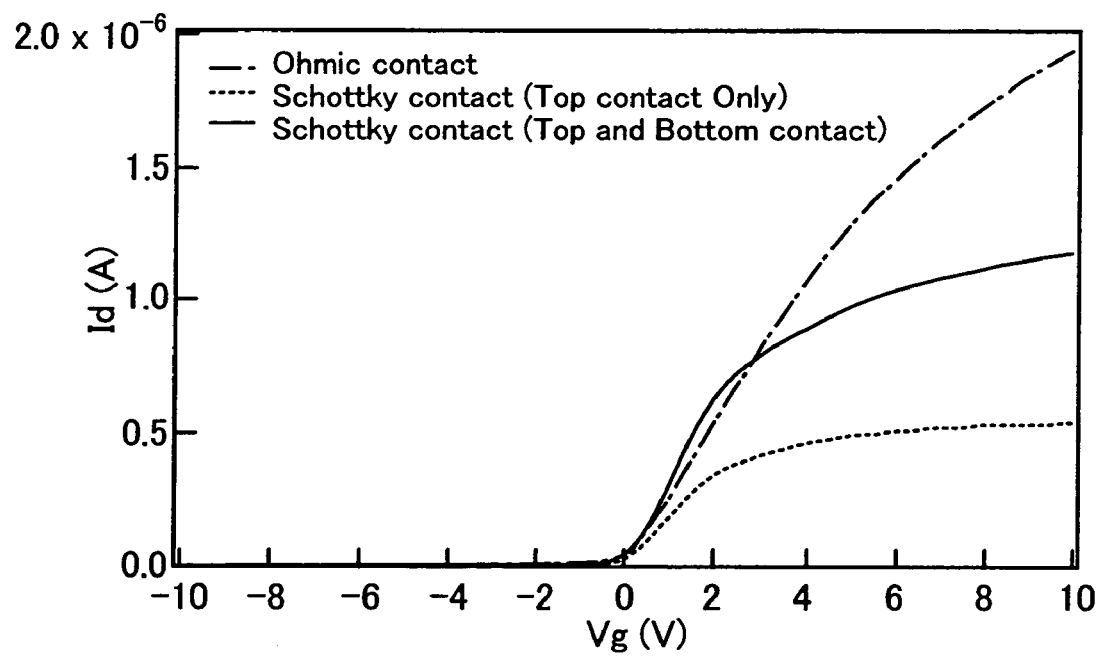
FIG. 4 shows a result of calculating transistor characteristics of a TFT of the present invention.

In FIG. 4, a line interrupted by a single dot (hereinafter called "curved line 1") indicates a calculation result of a Vg-Id curved line in a case where source or drain electrodes and the semiconductor layer are in contact only in an upper portion of the semiconductor layer, and form ohmic contact without contact resistance.

A dotted line (hereinafter called "curved line 2") indicates a calculation result of the Vg-Id curved line in a case where the source or drain electrodes and the semiconductor layer are in contact only in the upper portion of the semiconductor layer, and where 0.2 eV is applied as a Schottky barrier.

A solid line (hereinafter called "curved line 3") indicates a calculation result of the Vg-Id curved line of a structure of a TFT of the present invention. In other words, curved line 3 is a calculation result of the Vg-Id curved line in a case where the source or drain electrodes and the semiconductor layer are in contact in the upper portion and a lower portion of the semiconductor layer, and where 0.2 eV is applied as Schottky barriers thereof.

The case of curved line 1 in which there is ohmic contact without contact resistance is equivalent to a case where the semiconductor layer and the electrodes are heated to eliminate contact resistance when a TFT is actually manufactured. On the other hand, the case of curved line 2 and curved line 3 where there is a Schottky barrier is equivalent to a case where heating of the semiconductor layer and the electrodes is not performed and resistance exists.

Curved line 1 is an ideal case where there is not contact resistance between the semiconductor layer and the electrodes. However, normally, contact resistance occurs between the semiconductor layer and the electrodes and this decreases on current and mobility. Curved line 2 shows a case where there is contact resistance equivalent to a Schottky barrier of 0.2 eV between the semiconductor layer and the electrodes. When curved line 2 is examined, it is apparent that on current is decreased due to contact resistance. To reduce contact resistance, a heat treatment at high temperature may be performed; however, when a plastic film or paper is used as a substrate, it is difficult to reduce contact resistance by a heat treatment.

As it is clear from comparing curved line 2 and curved line 3, in the case where the semiconductor layer and the electrodes are in contact in both the upper portion and the lower portion of the semiconductor layer (curved line 3), contact resistance is reduced and on current is about twice as large as that of the case where they are in contact only in the upper portion of the semiconductor layer (curved line 2). Therefore, by using the present invention, on current of a TFT can be doubled without a heat treatment at high temperature.

Also, although on current can be doubled if channel width is doubled, a size of a device increases by that much, and integration density of the device decreases. However, if a TFT in which a source region and a drain region are sandwiched from above and below by wirings is used, on current can be doubled without changing the size of an element.

Embodiment 3

This embodiment describes an example of manufacturing a semiconductor device of the present invention by an inkjet method, with reference to FIGS. 5A to 5E.

Figure 5A:
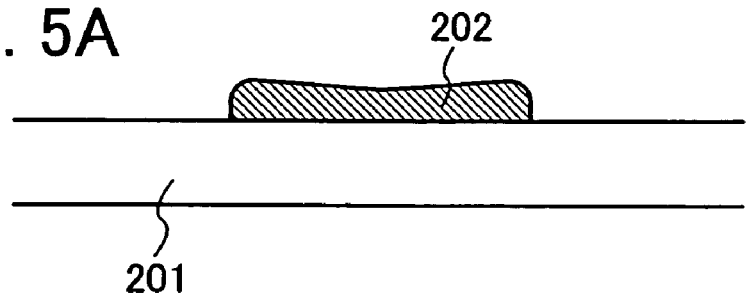
FIGS. 5A to 5E each show a manufacturing step of a semiconductor device of the present invention.

A gate electrode 202 is formed over a substrate 201 using a conductive paste, by an inkjet method (see FIG. 5A).

As the conductive paste, a conductive paste containing a metal material such as silver (Ag), gold (Au), copper (Cu) or nickel (Ni); or a conductive carbon paste can be used.

Figure 5B:
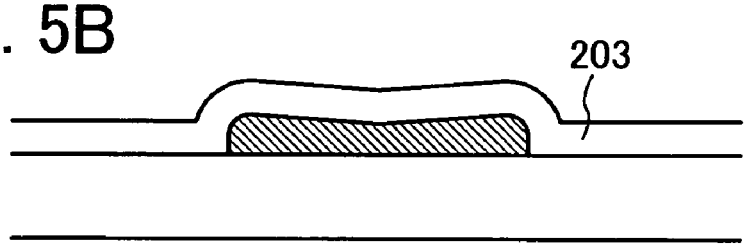
Figure 5C:
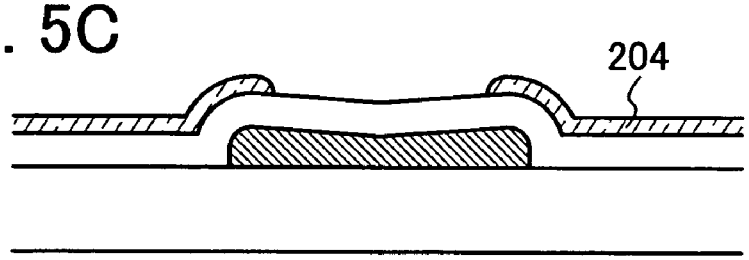
Figure 5D:
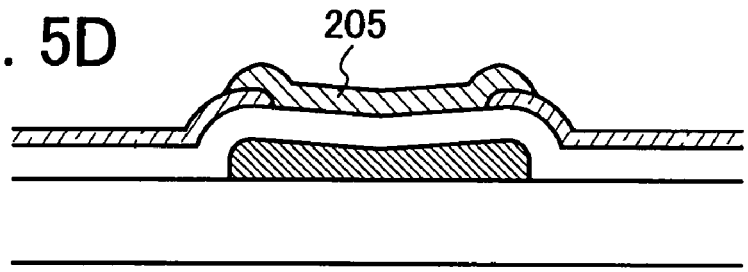
Figure 5E:
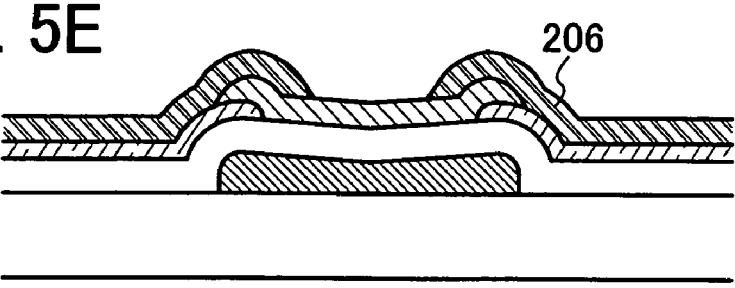

A gate insulating film 203 is formed over the substrate 201 and the gate electrode 202 by an inkjet method (see FIG. 5B).

As a material for the gate insulating film 203, a composition containing a phtosensitizer may be used. For example, a positive type resist made of a novolac resin and a naphthoquinone diazide compound, or a negative type resist made by dissolving or dispersing a base resin, diphenylsilanediol, an acid generator, and the like in a solvent is used. As the solvent, esters such as butyl acetate or ethyl acetate; alcohols such as isopropyl alcohol or ethyl alcohol; or organic solvents such as methyl ethyl ketone or acetone is used. Concentration of the solvent may be appropriately set depending on the type of resist.

First source or drain electrodes 204 are formed over the gate insulating film 203. The first source or drain electrodes 204 may be formed using a similar material and process to those of the gate electrode 202.

Subsequently, an island-shaped semiconductor film 205 is formed. In this embodiment, the island-shaped semiconductor film 205 is formed using an organic semiconductor material by an inkjet method. For the organic semiconductor material, either a low molecular compound or a high molecular compound can be used as long as it is an organic material that has a carrier transporting property, and by which modulation in carrier density can occur by an electrical field effect.

The type of the organic semiconductor material is not particularly limited; however, a polycyclic aromatic compound, a conjugated double bond compound, a metallophthalocyanine complex, a charge transfer complex, condensed ring tetracarboxylic diimides, oligothiophenes, fullerenes, a carbon nanotube, and the like are given. For example, polypyrrole, polythiophene, poly(3alkylthiophene), polyisothianaphthene, polythienylenevinylene, poly(p-phenylenevinylene), polyaniline, polydiacetylene, polyazulene, polypyrene, polycarbazole, polyselenophene, polyfuran, poly(p-phenylene), polyindole, polypyridazine, naphthacene, hexacene, heptacene, pyrene, chrysene, perylene, coronene, terrylene, ovalene, quaterrylene, circumanthracene, triphenodioxazine, triphenodiriazine, hexacene-6,15-quinone, polyvinylcarbazole, polyphenylenesulfide, polyvinylenesulfide, polyvinylpyridine, naphthalenetetracarboxylic diimide, anthracenetetracarboxylic diimide, $C_{60}$, $C_{70}$, $C_{76}$, $C_{78}$, $C_{84}$, and a derivative thereof can be used. As a specific example of these materials, there are tetracene, pentacene, sexithiophene (6T), α,ω-dihexyl-sexithiophene, copper phthalocyanine, 5-benzylidene-2,4-dioxotetrahydro-1,3-thiazole, 2,2'-bi(dithieno[3,2-b:2',3'-d]thiophene), bis-(1,2,5-thiadiazolo)-p-quinobis(1,3-dithiol), di(4-biphenyl)-α-thiophene, 2,5-di(4-biphenylyl)thiophene, di(4-biphenyl)-α-bithiophene, 5,5'-di(4-biphenylyl)-2,2-bithiophene, di(4-biphenyl)-α-terthiophene, 5,5"-di(4-biphenylyl)-2,2':5',2"-terthiophene, di(4-biphenyl)-α-quaterthiophene, 5,5'"-di(4-biphenylyl)-α-quaterthiophene, dihexylanthradithiophene, 2,8-dihexylanthra[2,3-b:6,7-b']dithiophene, rubrene, dihexyl-α-tetrathiophene, 5,5'''-di(4-biphenylyl)-α-quaterthiophene, dihexyl-α-pentathiophene, 5,5'''-dihexyl-α-quinquethiophene, poly(2,5-thienylenevinylene) (abbreviation: PTV), poly(3-hexylthiophene-2,5-diyl) (abbreviation: P3HT), or poly(9,9'-dioctyl-fluorene-co-bithiophene) (abbreviation: F8T2) which is generally considered as a p-type semiconductor; 7,7,8,8,-tetracyanoquinodimethane (abbreviation: TCNQ), 3,4,9,10-perylenetetracarboxylicdianhydride (abbreviation: PTCDA), 1,4,5,8-naphthalenetetracarboxylicdianhydride (abbreviation: NTCDA), 9,9,10,10,-tetracyano-2,6-naphthaquinodimethane (abbreviation: TCNNQ), N,N'-dioctyl-3,4,9,10-perylenetetracarboxylicdiimide (abbreviation: PTCDI-C8H), copper16phthalocyaninefluoride (abbreviation: $F_{16}CuPc$), N,N'-2,2,3,3,4,4,5,5,6,6,7,7,7-di15hexylfluoride-1,4,5,8-naphthalenetetracarboxylicdiimide (abbreviation: NTCDI-C8F), α,ω-bis(perfluorohexyl)sexithiophene (abbreviation: DFH-6T), 3',4'-dibutyl-5,5"-bis(dicyanomethylene)-5,5"-dihydro-2,2':5',2"-terthiophene) (abbreviation: DCMT), or methanofullerene[6,6]-phenyl $C_{61}$ butyric acid methyl ester (abbreviation: PCBM) which is generally considered as an n-type semiconductor; and the like.

Note that p-type or n-type characteristic of the organic semiconductor is not inherent to the substance, but depends on a relationship with an electrode to which carriers are injected and an intensity of an electric field during the injection. Although a substance has its own tendency of becoming a p-type or an n-type, the organic semiconductor can be used as a p-type semiconductor or an n-type semiconductor.

Subsequently, second source or drain electrodes 206 are formed to be in contact with the island-shaped semiconductor film 205 and the first source or drain electrodes 204. The second source or drain electrodes 206 may be formed using a similar material and process to those of the first source or drain electrodes 204.

In the above manner, the semiconductor device of this embodiment is manufactured. Since the semiconductor device of this embodiment is formed by an inkjet method, a manufacturing process can be shortened, and manufacturing cost can be kept low.

Note that although the semiconductor device of this embodiment is formed by an inkjet method, manufacturing methods described in the embodiment mode and other embodiments may be combined if necessary, and it may be that an inkjet method is used just in a necessary step.

In this manner, a source region and a drain region of the semiconductor device of this embodiment each have a structure of being sandwiched from above and below by source or drain electrodes; therefore, contact resistance of the source or drain electrodes and the semiconductor film can be reduced. Also, since there are two layers of the source or drain electrodes, wiring resistance can also be reduced. Further, since the first source or drain electrodes that are formed under the semiconductor film can be formed to be thin, even in a case of using an organic semiconductor film, coverage thereof can be improved to improve TFT characteristics, and reliability of the TFT can also be improved.

Embodiment 4

In this embodiment, an example of forming a semiconductor film added with an impurity imparting one conductivity type between an island-shaped semiconductor film and second source or drain electrodes which are formed over the island-shaped semiconductor film, is described with reference to FIGS. 6A to 6D.

Figure 6A:
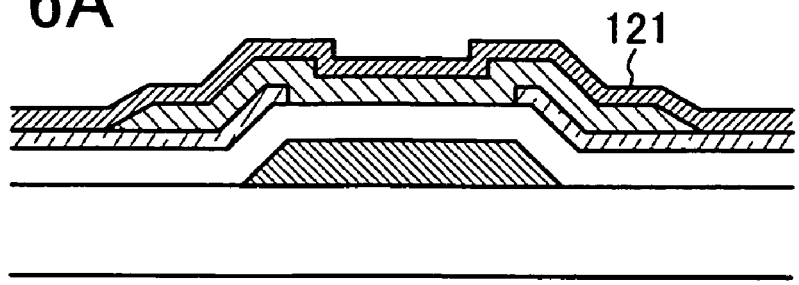
FIGS. 6A to 6D each show a manufacturing step of a semiconductor device of the present invention.

First, formation of up to the island-shaped semiconductor film 105 shown in FIG. 6A is performed according to the embodiment mode and Embodiment 1. Subsequently, a semiconductor film 121 added with an impurity imparting one conductivity type is formed by a CVD method or the like (see FIG. 6A).

For the impurity imparting one conductivity type, phosphorus (P) or arsenic (As) which is an impurity imparting n-type conductivity may be used when forming an n-channel TFT, and boron (B) which is an impurity imparting p-type impurity may be used when forming a p-channel TFT.

Figure 6B:
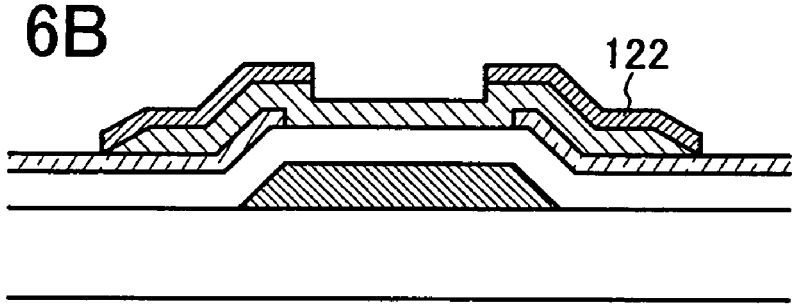

Subsequently, etching is performed on the semiconductor film 121 added with the impurity imparting one conductivity type using a resist that is an etching mask, to form island-shaped impurity semiconductor films 122 each serving as a source region or drain region (see FIG. 6B). Also, a channel forming region is formed in a region of the island-shaped semiconductor film 105 that is between a source region and a drain region.

Figure 6C:
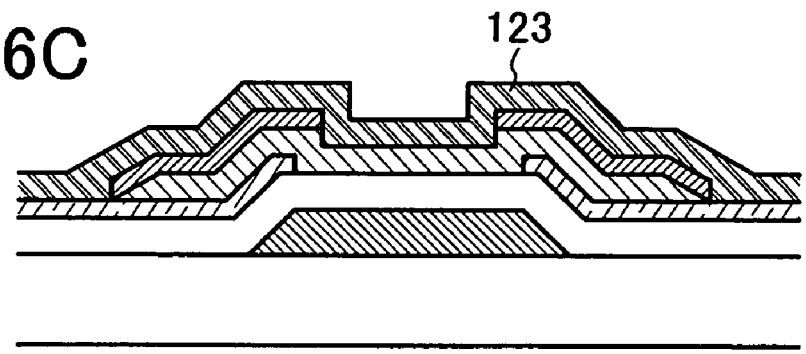

Next, a conductive film 123 is formed over the first source or drain electrodes 104 and the island-shaped impurity semiconductor films 122 (see FIG. 6C). As the conductive film 123, a single layer film of a titanium (Ti) film, a tungsten (W) film, a polycrystalline silicon (poly-Si) film, an aluminum (Al) film, a tantalum (Ta) film, a molybdenum (Mo) film, or the like; or a stacked layer film that is a combination thereof can be used.

Figure 6D:
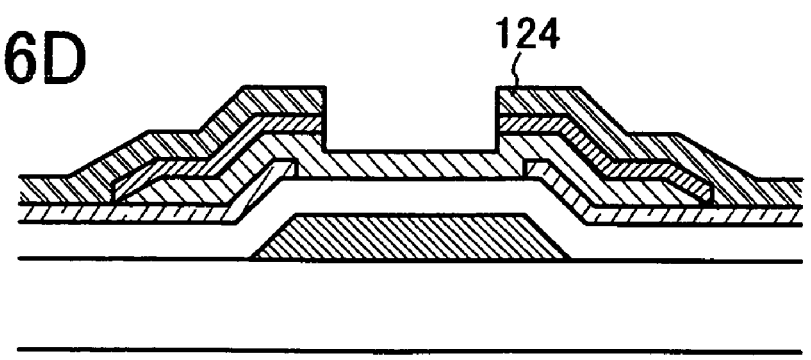
Figure 9:
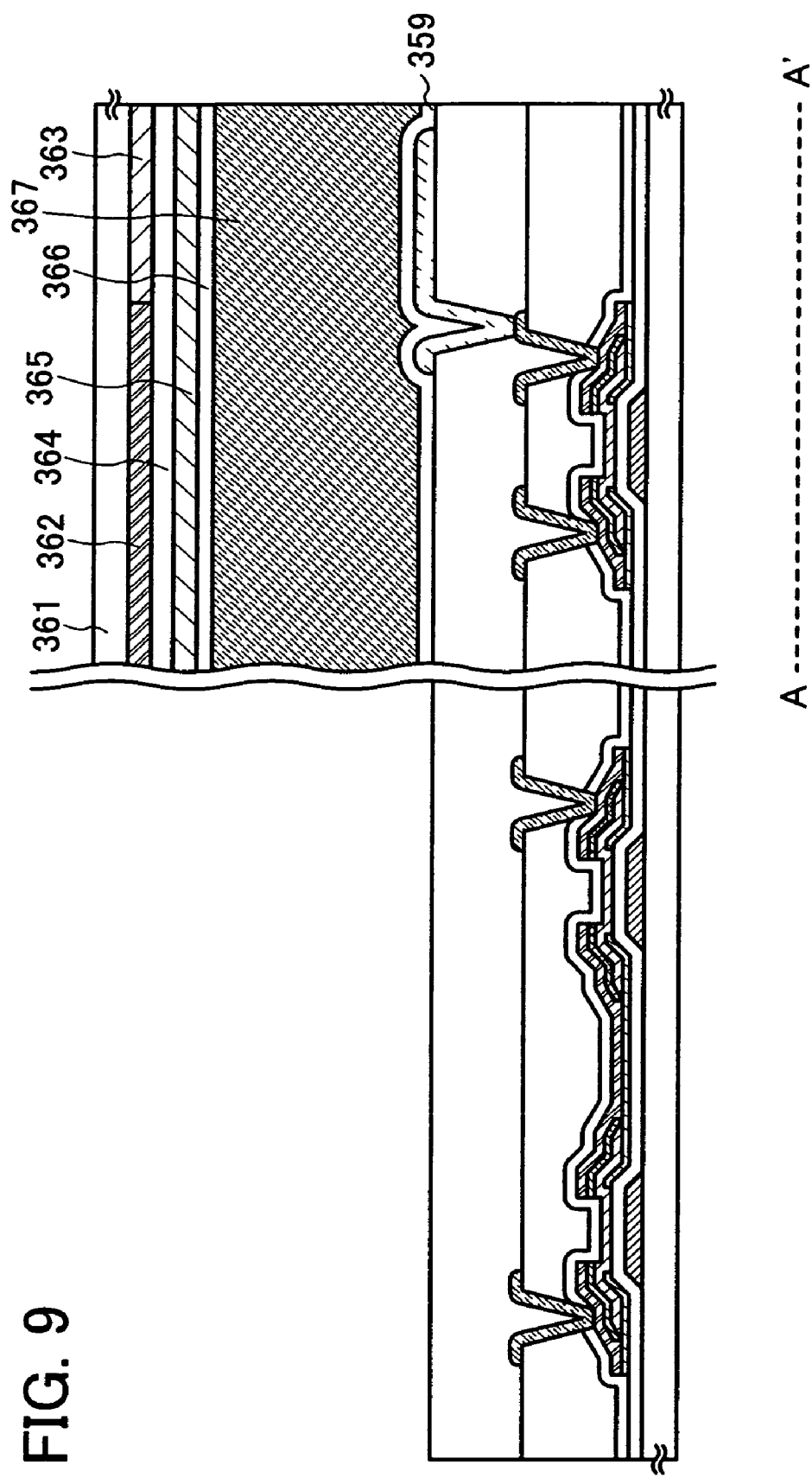
FIG. 9 shows a manufacturing step of a liquid crystal display device of the present invention.

Subsequently, the conductive film 123 is etched to form second source or drain electrodes 124 (see FIG. 6D). In the above manner, the semiconductor device of this embodiment is formed.

In this manner, the source region and the drain region of the semiconductor device of this embodiment each have a structure of being sandwiched from above and below by the source or drain electrodes; therefore, contact resistance of the source or drain electrodes and the semiconductor film can be reduced. Also, since there are two layers of the source or drain electrodes, wiring resistance can also be reduced. Further, since the first source or drain electrodes that are formed under the semiconductor film can be formed to be thin, coverage of the semiconductor film can be improved to improve TFT characteristics, and reliability of the TFT can also be improved.

Embodiment 5

In this embodiment, an example of manufacturing a liquid crystal display device using the present invention is described with reference to FIGS. 7A to 12B.

First, based on the description in the embodiment mode and Embodiments 1 and 4, n-channel TFTs 355 and 357, and a p-channel TFT 356 are formed over a substrate 301 (see FIG. 7A). The n-channel TFT 355 and the p-channel TFT 356 form a CMOS circuit 358.

The n-channel TFT 355 includes a gate electrode 302, a gate insulating film 305, first source or drain electrodes 311 and 312, an island-shaped semiconductor film 317 serving as a channel forming region, island-shaped impurity semiconductor films 321 and 322 each serving as a source region or drain region, and second source or drain electrodes 331 and 332.

The p-channel TFT 356 includes a gate electrode 303, the gate insulating film 305, the first source or drain electrode 312 and a first source or drain electrode 313, an island-shaped semiconductor film 318 serving as a channel forming region, island-shaped impurity semiconductor films 323 and 324 each serving as a source region or drain region, and the second source or drain electrode 332, and a second source or drain electrode 333.

The n-channel TFT 355 and the p-channel TFT 356 are electrically connected by the first source or drain electrode 312 and the second source or drain electrode 332, to form the CMOS circuit 358.

The n-channel TFT 357 includes a gate electrode 304, the gate insulating film 305, first source or drain electrodes 314 and 315, an island-shaped semiconductor film 319 serving as a channel forming region, island-shaped impurity semiconductor films 325 and 326 each serving as a source region or drain region, and second source or drain electrodes 334 and 335.

As the substrate 301, a similar substrate to the substrate 101 of the embodiment mode and Embodiment 1 may be used. Also, the gate electrodes 302 to 304, the gate insulating film 305, the first source or drain electrodes 311 to 315, the island-shaped semiconductor films 317 to 319, and the second source or drain electrodes 331 to 335 may be formed with reference to the gate electrode 102, the gate insulating film 103, the first source or drain electrodes 104, the island-shaped semiconductor film 105, and the second source or drain electrodes 106 of the embodiment mode and Embodiment 1, respectively.

Further, each of the island-shaped impurity semiconductor films 321 and 322 of the n-channel TFT 355 as well as the island-shaped impurity semiconductor films 325 and 326 of the n-channel TFT 357 may be formed by forming a semiconductor film added with phosphorus (P) or arsenic (As) which is an impurity imparting n-type conductivity. On the other hand, each of the island-shaped impurity semiconductor films 323 and 324 of the p-channel TFT 356 may be formed by forming a semiconductor film added with boron (B) which is an impurity imparting p-type conductivity.

Also, although the TFT 357 functions as a pixel TFT in the liquid crystal display device of this embodiment, a p-channel TFT instead of an n-channel TFT may be used as the pixel TFT if necessary. In that case, each of the island-shaped impurity semiconductor films 325 and 326 of the TFT 357 may be formed using a semiconductor film added with a p-type impurity instead of a semiconductor film added with an n-type impurity.

Subsequently, a first interlayer insulating film 341 is formed over the n-channel TFT 355, the p-channel TFT 356, and the n-channel TFT 357.

As the first interlayer insulating film 341, an insulating film containing silicon, for example a silicon oxide film, a silicon nitride film, or a silicon oxide film containing nitrogen; or a stacked layer film thereof is formed by a sputtering method. Of course, the first interlayer insulating film 341 is not limited to the silicon oxide film containing nitrogen, the silicon nitride film, or the stacked layer film thereof, and a single layer or a stacked layer of another insulating film containing silicon may be used. Further, if possible, the first interlayer insulating film 341 may be formed using the foregoing materials by a plasma CVD method.

In this embodiment, after introducing the impurity, a silicon oxide film containing nitrogen is formed to have a thickness of 50 nm by a sputtering method. At that time, laser irradiation may be performed over the silicon oxide film containing nitrogen to activate the impurity.

For laser crystallization, a continuous wave laser or a pulsed laser with a repetition rate of 10 MHz or more, preferably 80 MHz or more as a pseudo CW laser can be used.

Specifically, the following and the like can be given as the continuous wave laser: an Ar laser, a Kr laser, a $CO_2$ laser, a YAG laser, a $YVO_4$ laser, a forsterite ($Mg_2SiO_4$) laser, a YLF laser, a $YAlO_3$ laser, a $GdVO_4$ laser, a $Y_2O_3$ laser, an alexandrite laser, a Ti:sapphire laser, a helium cadmium laser, and a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Also, as the pseudo CW laser, a pulsed laser such as the following can be used if pulse oscillation has a repetition rate of 10 MHz or more, preferably 80 MHz or more: an Ar laser, a Kr laser, an excimer laser, a $CO_2$ laser, a YAG laser, a $Y_2O_3$ laser, a $YVO_4$ laser, a forsterite ($Mg_2SiO_4$) laser, a YLF laser, $YAlO_3$ laser, a $GdVO_4$ laser, an alexandrite laser, a Ti:sapphire laser, a copper vapor laser, a gold vapor laser, or a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Such a pulsed laser eventually exhibits an effect equivalent to that of a continuous wave laser when repetition rate is increased.

Subsequently, a silicon nitride film is formed to have a thickness of 50 nm by a sputtering method, and further, a silicon oxide film containing nitrogen is formed to have a thickness of 60 nm. A stacked layer film of these silicon oxide film containing nitrogen, silicon nitride film, and silicon oxide film containing nitrogen is the first interlayer insulating film 341.

Next, the substrate and everything formed thereover are heated at 410° C. for 1 hour, and hydrogenation is performed by releasing hydrogen from the silicon nitride film.

Subsequently, a second interlayer insulating film 342 functioning as a planarization film is formed covering the first interlayer insulating film 341 (see FIG. 7B).

As the second interlayer insulating film 342, a photosensitive or non-photosensitive organic material (polyimide, acrylic, polyamide, polyimide amide, a resist, or benzocyclobutene), siloxane, or a stacked layer structure thereof can be used. As the organic material, a positive-type photosensitive organic resin or a negative-type photosensitive organic resin can be used.

Note that siloxane has a skeleton that is structured by a bond between silicon (Si) and oxygen (O), and uses an organic group containing at least hydrogen for a substituent. Also, for the substituent, a fluoro group may be used. Further, an organic group containing at least hydrogen, and a fluoro group may be used for the substituent.

In this embodiment, siloxane is formed as the second interlayer insulating film 342 by a spin coating method.

Etching is performed on the first interlayer insulating film 341 and the second interlayer insulating film 342 to form contact holes in the first interlayer insulating layer 341 and the second interlayer insulating film 342 that reach the second source or drain electrodes 331, 333, 334 and 335.

Note that a third interlayer insulating film may be formed over the second interlayer insulating film 342, and the contact holes may be formed in the first interlayer insulating film to the third interlayer insulating film. As the third interlayer insulating film, a film that does not easily allow permeation of moisture, oxygen, or the like compared to other insulating films is used. Typically, a silicon nitride film, a silicon oxide film, a silicon nitride film containing oxygen, a silicon oxide film containing nitrogen, a thin film mainly containing carbon (for example, a DLC film, or a CN film), or the like obtained by a sputtering method or a CVD method can be used.

A third conductive film is formed over the second interlayer insulating film 342 via a contact hole, and an electrode or wiring 345, an electrode or wiring 346, and electrode or wiring 347, and an electrode or wiring 348 (also collectively referred to as electrodes or wirings 345 to 348) are formed using the third conductive film.

In this embodiment, a metal film is used for the third conductive film. As the metal film, a film made of an element of aluminum (Al), titanium (Ti), molybdenum (Mo), tungsten (W), or silicon (Si), or an alloy film using such an element may be used. In this embodiment, a titanium (Ti) film, a titanium nitride (TiN) film, a silicon-aluminum alloy (Al—Si) film, and a titanium (Ti) film with thicknesses of 60 nm, 40 nm, 300 nm, and 100 nm, respectively, are stacked, and then subsequently etched into a desired shape to form the electrodes or wirings 345 to 348.

Also, these electrodes or wirings 345 to 348 may be formed of at least one element selected from nickel, cobalt, and iron, or an aluminum alloy film containing carbon. With such an aluminum alloy film, mutual diffusion of silicon and aluminum can be prevented even if it comes into contact with silicon. Also, with such an aluminum alloy film, an oxidation-reduction reaction does not occur even if it comes into contact with a transparent conductive film, for example an indium tin oxide (ITO) film; therefore, they can come into direct contact with each other. Also, since such an aluminum alloy film has low specific resistance as well as excellent heat resistance, it is useful as a wiring material.

Also, in forming the electrodes or wirings 345 to 348, an electrode and a wiring may be formed in the same step with the same material, or the electrode and the wiring may be formed separately and then connected.

Subsequently, a third interlayer insulating film 351 is formed over the second interlayer insulating film 342 and the electrodes or wirings 345 to 348. Note that the third interlayer insulating film 351 can be formed using a similar material to that of the second interlayer insulating film 342.

Note that when a film that does not easily allow permeation of moisture, oxygen, or the like compared to other insulating films is formed as the third interlayer insulating film over the second interlayer insulating film 342, the insulating film 351 serves as a fourth interlayer insulating film.

Subsequently, a resist mask is formed using a photomask, and a portion of the third interlayer insulating film 351 is removed by dry etching to form a contact hole. In forming this contact hole, carbon tetrafluoride ($CF_4$), oxygen ($O_2$), and helium (He) are used as an etching gas with a flow amount of 50 sccm, 50 sccm, and 30 sccm, respectively. Note that the base of the contact hole reaches the conductive film 348 functioning as an electrode or wiring.

Subsequently, after removing the resist mask, a conductive film is formed over the entire surface. Then, a pixel electrode 352 that is electrically connected to the conductive film 348 functioning as an electrode or wiring is formed using a second conductive film (see FIG. 8B).

When manufacturing a transmissive type liquid crystal display device, the pixel electrode 352 is formed using a transparent conductive film such as indium tin oxide (ITO), indium tin oxide containing silicon oxide, zinc oxide (ZnO), or tin oxide ($SnO_2$).

On the other hand, when manufacturing a reflective type liquid crystal display device, the pixel electrode 352 may be formed using a metal material having a light reflective property such as Ag (silver), Au (gold), Cu (copper), W (tungsten), or Al (aluminum), by a sputtering method.

Figure 10:
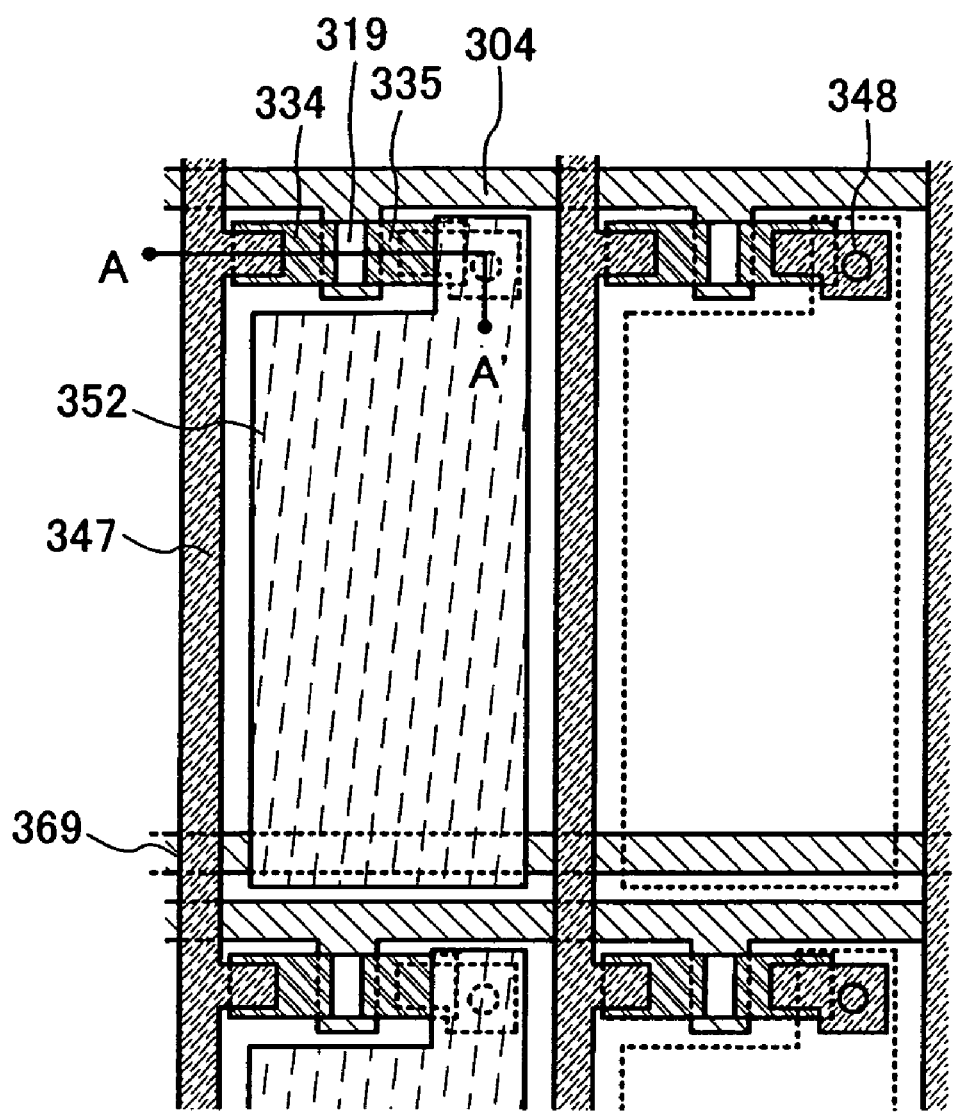
FIG. 10 shows pixel portion of a liquid crystal display device of the present invention.

FIG. 10 shows an enlarged top view of a portion of a pixel portion 371 including an n-channel TFT 357 serving as a pixel TFT. Further, FIG. 10 shows a pixel electrode formation in progress, and shows a state in which a pixel electrode is formed in a pixel on the left side, but not in a pixel on the right side. In FIG. 10, a cross-sectional view along a solid line A-A' corresponds to the cross-section of a pixel portion in FIG. 9, and the same reference numerals are used for portions corresponding to FIGS. 7A to 8B.

A capacitor wiring 369 is provided for each pixel, and a storage capacitor is formed including the pixel electrode 352 and the capacitor wiring 369 that overlaps with the pixel electrode 352, with the first interlayer insulating film 341 as a derivative.

Note that in this embodiment, in a region in which the pixel electrode 352 and the capacitor wiring 369 overlap each other, the second interlayer insulating film 342 and the third interlayer insulating film 351 are etched, and the storage capacitor is formed with the pixel electrode 352, the first interlayer insulating film 341 and the capacitor wiring 369. However, if the second interlayer insulating film 342 and the third interlayer insulating film 351 can be used as derivatives, then etching is not necessary to be performed on the second interlayer insulating film 342 and the third interlayer insulating film 351. In that case, the first interlayer insulating film 341, the second interlayer insulating film 342, and the third interlayer insulating film 351 function as derivatives. Alternatively, it may be that only the third interlayer insulating film 351 is etched, and the first interlayer insulating film 341 and the second interlayer insulating film 342 may be used as derivatives.

By the foregoing step, a TFT substrate of a liquid crystal display device in which the pixel TFT 357, the n-channel TFT 355 and the p-channel TFT 356 that structure the CMOS circuit 358, and the pixel electrode 352 are formed over the substrate 301, is completed.

Next, an orientation film 359 is formed so as to cover the pixel electrode 352. Note that a droplet discharging method, a screen printing method, or an offset printing method may be used to form the orientation film 359. Subsequently, a rubbing treatment is performed on a surface of the orientation film 359.

Then, over an opposing substrate 361, a color filter including a coloring layer 363, a light shielding layer (a black matrix) 362, and an overcoat layer 364 is provided. Further, an opposing electrode 365 made of a transparent electrode or a reflective electrode is formed, as well as an orientation film 366 thereover (see FIG. 9).

Figure 11A:
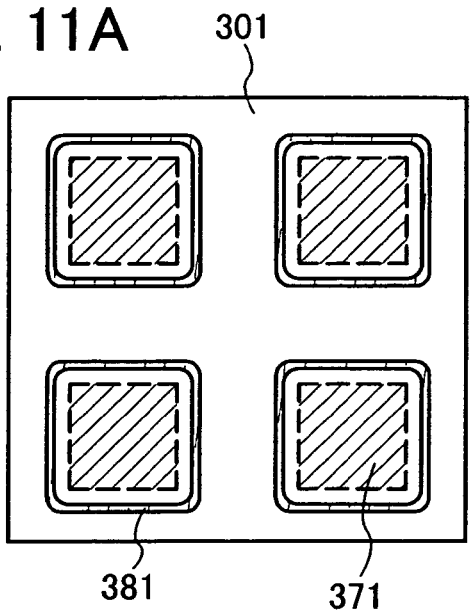
FIGS. 11A to 11D each show a manufacturing step of a liquid crystal display device of the present invention.
Figure 11B:
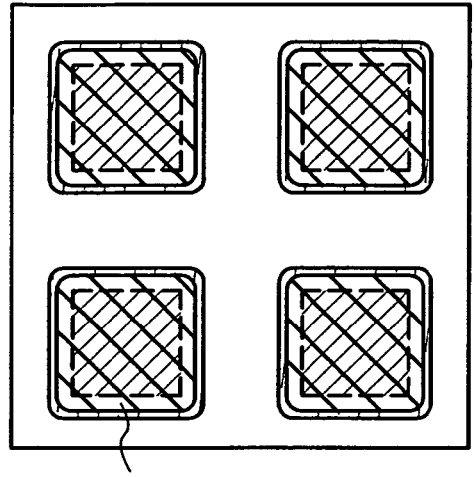

Subsequently, a sealant 381 of a closed pattern is formed by a droplet discharging method so as to surround a region which overlaps with the pixel portion 371 including a pixel TFT (see FIG. 11A). Here, an example of drawing the sealant 381 of a closed pattern is shown because liquid crystal is dropped; however, a dipping method (a pumping method) may be used in which a seal pattern having an opening portion is provided and then liquid crystal is injected by a capillary phenomenon after attaching the substrate 301.

Figure 11C:
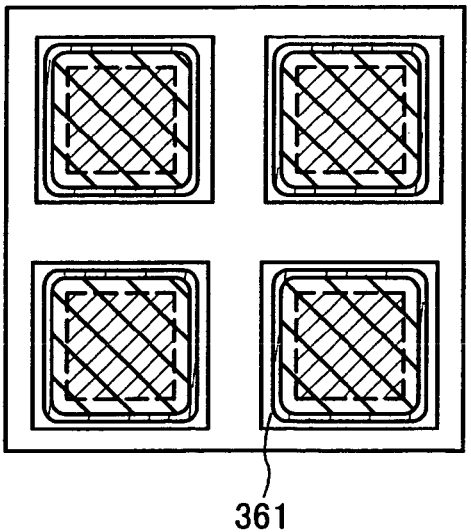
Figure 11D:
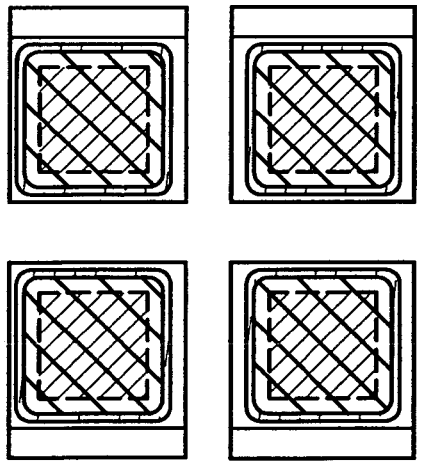

Next, a liquid crystal 367 is dropped under reduced pressure so that air bubbles do not enter (see FIG. 11B), and the TFT substrate 301 and the opposing substrate 361 are attached together (see FIG. 11C). The liquid crystal 367 is dropped one time or a plurality of times within a closed loop seal pattern. As an orientation mode of the liquid crystal 367, a TN mode is used in many cases, in which an alignment of liquid crystal molecules twists by 90° from where light enters to where it exists. When a liquid crystal display device of the TN mode is manufactured, substrates are attached together so that rubbing directions of the substrates are perpendicular to each other.

Note that space between a pair of substrates may be maintained by dispersing a spherical spacer, forming a columnar spacer made of a resin, or including a filler in the sealant 381. The columnar spacer is an organic resin material mainly containing at least one of acrylic, polyimide, polyimide amide, and epoxy; or an inorganic material of a single layer film of one material selected from silicon oxide, silicon nitride, or silicon oxide containing nitrogen, or a stacked layer film thereof.

Subsequently, the substrates are divided. In a case of obtaining a plurality of panels from the substrates, each panel is separated off. In a case of obtaining one panel from the substrates, a division step can be skipped by attaching an opposing substrate that is cut in advance (see FIG. 11D).

Then, an FPC (flexible printed circuit) is attached via an anisotropic conductive layer by a known technique. By the foregoing step, the liquid crystal display device of this embodiment is completed. Further, if necessary, an optical film is attached. In a case of a transmissive type liquid crystal display device, a polarizing plate is attached to each of the TFT substrate 301 and the opposing substrate 361.

Figure 12A:
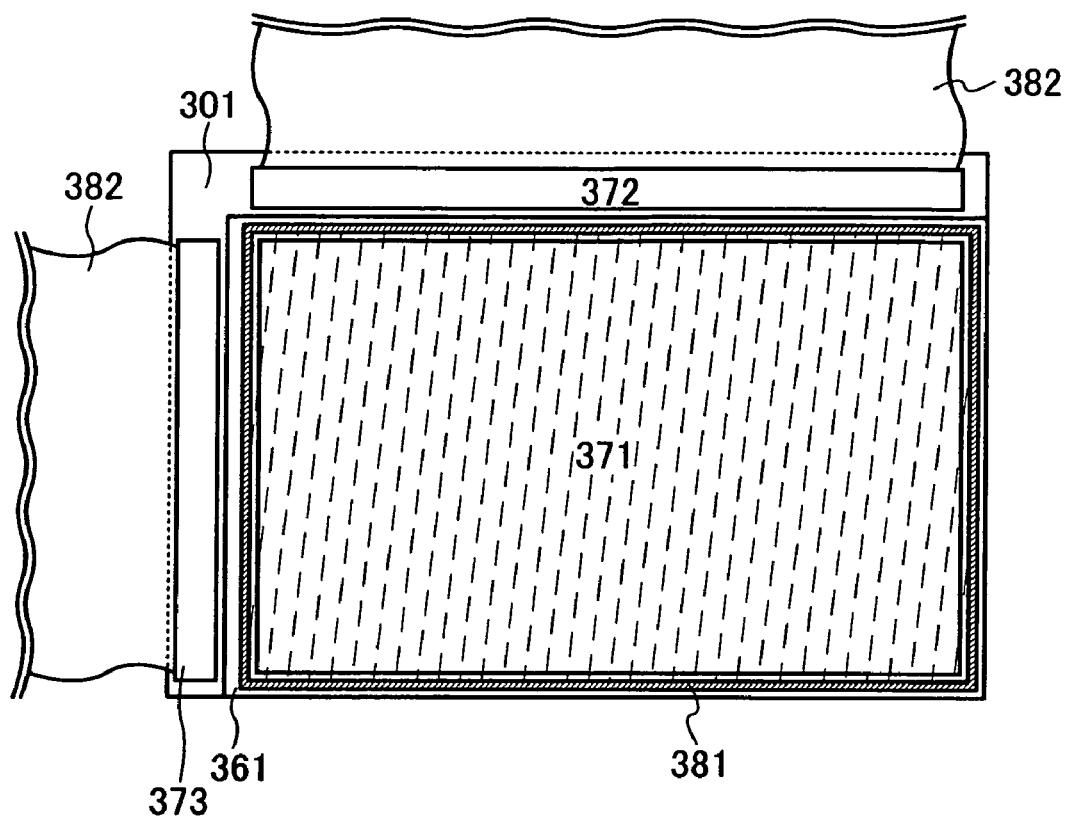
FIGS. 12A and 12B each show a top view of a liquid crystal display device of the present invention.
Figure 12B:
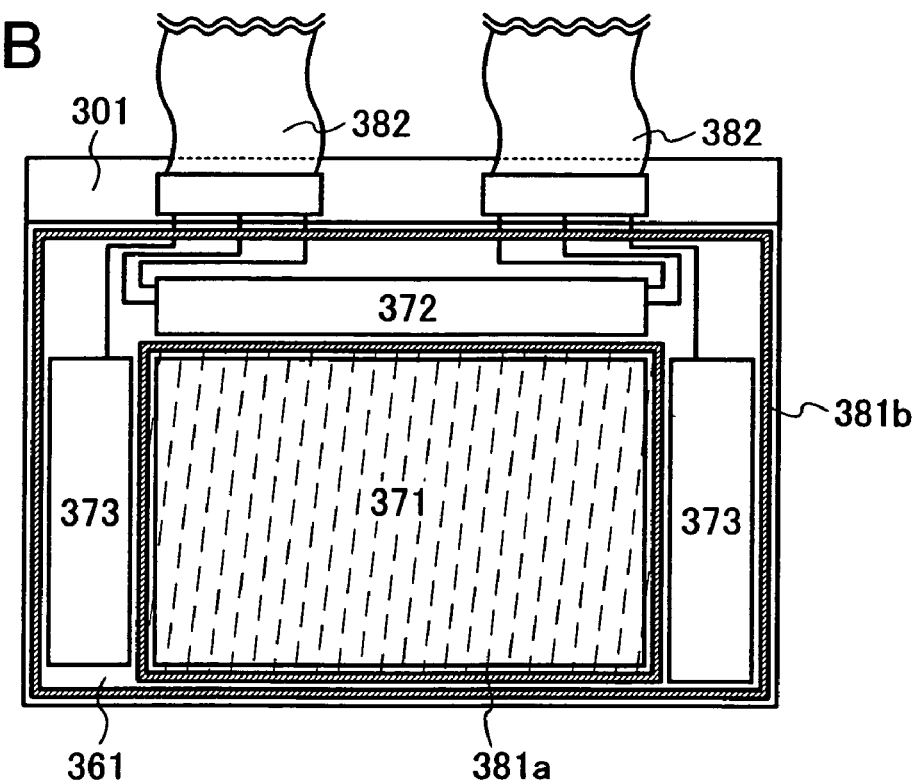

A top view of the liquid crystal display device obtained by the foregoing step is shown in FIG. 12A, and an example of a top view of another liquid crystal display device is shown in FIG. 12B.

In FIG. 12A, reference numerals 301, 361, 371, 372, 373, 381, and 382 denote the TFT substrate, the opposing substrate, the pixel portion, a source signal line driver circuit, a gate signal line driver circuit, the sealant, and an FPC, respectively. Note that liquid crystal is discharged by a droplet discharging method, and the substrate 301 and the opposing substrate 361 which are a pair are attached together by the sealant 381 under reduced pressure.

In FIG. 12B, reference numerals 301, 361, 372, 373, 371, 381a, and 382 denote the TFT substrate, the opposing substrate, the source signal line driver circuit, the gate signal line driver circuit, the pixel portion, a first sealant, and the FPC, respectively. Note that liquid crystal is discharged by a droplet discharging method, and the substrate 301 and the opposing substrate 361 which are a pair are attached together by the first sealant 381a and a second sealant 381b. Since liquid crystal is not required for the source signal line driver circuit 372 and the gate signal line driver circuit 373, liquid crystal is held just in the pixel portion 371, and the second sealant 381b is provided for reinforcement of the entire panel.

In this manner, the source region and the drain region of a semiconductor device of this embodiment have a structure of being sandwiched from above and below by source or drain electrodes; therefore, contact resistance of the source or drain electrodes and the semiconductor film can be reduced. Also, since there are two layers of the source or drain electrodes, wiring resistance can also be reduced. Further, since the first source or drain electrodes that are formed under the semiconductor film can be formed to be thin, coverage of the semiconductor film can be improved to improve TFT characteristics, and reliability of the liquid crystal display device as a whole can also be improved.

Also, this embodiment can be freely combined with the embodiment mode and Embodiments 1 to 4, if necessary.

Embodiment 6

In this embodiment, an example of using a droplet discharging method for dropping liquid crystal is described. In this embodiment, a manufacturing example of obtaining four panels using a large area substrate 400 is shown with reference to FIGS. 13A to 16B.

Figure 13A:
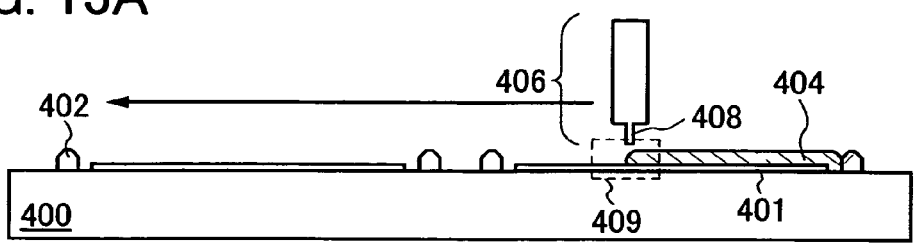
FIGS. 13A to 13D each show a manufacturing step of a liquid crystal display device using a liquid crystal dropping method of the present invention.

FIG. 13A shows a cross-sectional view of a liquid crystal layer formation by a dispenser (or an inkjet) in progress, and a liquid crystal material 404 is discharged, sprayed, or dropped from a nozzle 408 of a droplet discharging apparatus 406 so as to cover a pixel portion 401 that is surrounded by a sealant 402. The droplet discharging apparatus 406 is moved in the direction of an arrow in FIG. 13A. Note although that an example of moving the nozzle 408 is shown here, the liquid crystal layer may be formed by fixing the nozzle and moving the substrate.

Figure 13B:
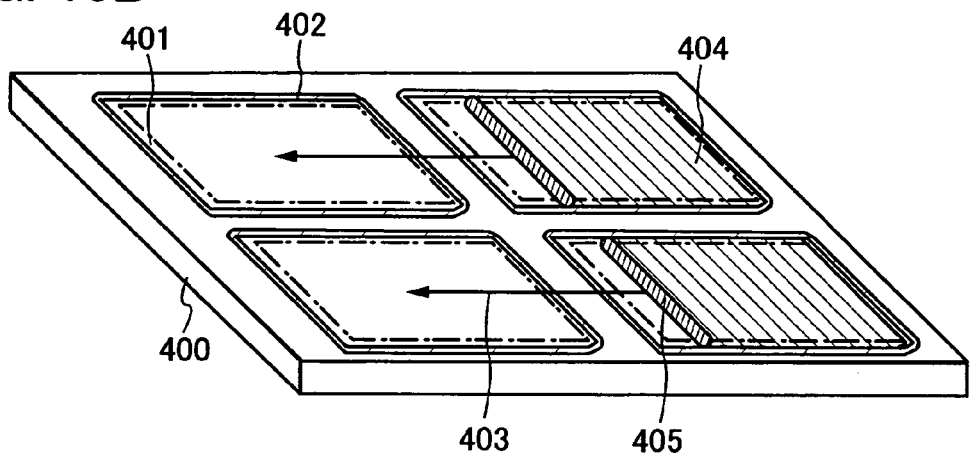

Also, a perspective view is shown in FIG. 13B, which shows a scene where the liquid crystal material 404 is selectively discharged, sprayed, or dropped just in regions surrounded by the sealant 402, and a dropping surface 405 is moved in a nozzle scanning direction 403.

Figure 13C:
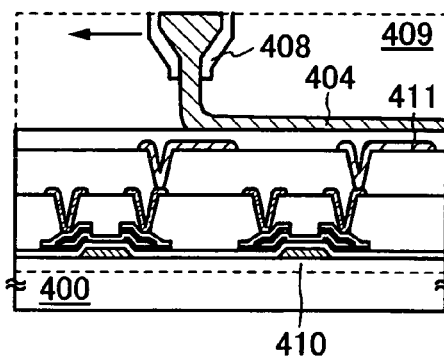
Figure 13D:
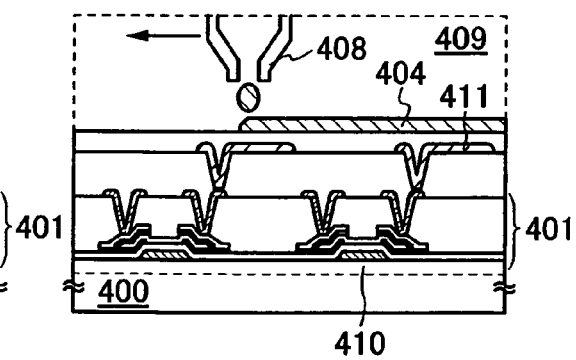

Also, FIGS. 13C and 13D each show an enlarged cross-sectional view of a portion 409 surrounded by a dotted line in FIG. 13A. When viscosity of the liquid crystal material is high, the liquid crystal material is discharged continuously, and sticks without a break as in FIG. 13C. On the other hand, when viscosity of the liquid crystal material is low, the liquid crystal material is discharged intermittently, and droplets are dropped in a dot form as in FIG. 13D.

Note that in FIG. 13C, reference numerals 410 and 411 denote a pixel TFT formed according to the present invention and a pixel electrode, respectively. The pixel portion 401 includes pixel electrodes arranged in a matrix form and a switching element connected to the pixel electrodes, and here, a bottom gate TFT and a storage capacitor are also included.

A panel manufacturing flow is described below with reference to FIGS. 14A to 15B.

First, the first substrate 400 with an insulating surface over which the pixel portion 401 is formed is prepared. For the first substrate 400, formation of an orientation film, rubbing treatment, dispersion of a spherical spacer or formation of a columnar spacer, formation of a color filter, or the like is performed in advance. For a detailed manufacturing method thereof, refer to Embodiment 5.

Figure 14A:
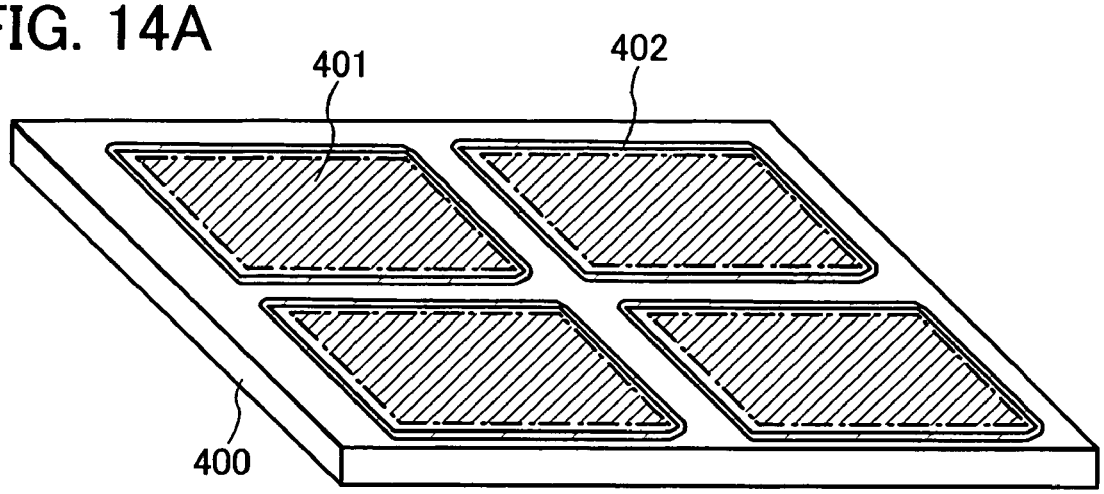
FIGS. 14A and 14B each show a manufacturing step of a liquid crystal display device using a liquid crystal dropping method of the present invention.

Subsequently, as shown in FIG. 14A, the sealant 402 is formed in a predetermined position (a pattern surrounding the pixel portion 401) over the first substrate 400 by a dispenser apparatus or an inkjet apparatus under an inert gas atmosphere or under reduced pressure. For the sealant 402 which is semi-transparent, a material including a filler (6 μm to 24 μm in diameter) and that which has a viscosity of 40 Pa·s to 400 Pa·s is used. Note that it is preferable that a material that does not dissolve in liquid crystal, which it comes into contact with later, is selected. As the sealant 402, an acrylic based light curable resin or an acrylic based heat curable resin may be used. Further, since it is a simple seal pattern, the sealant 402 can also be formed by a printing method.

Figure 14B:
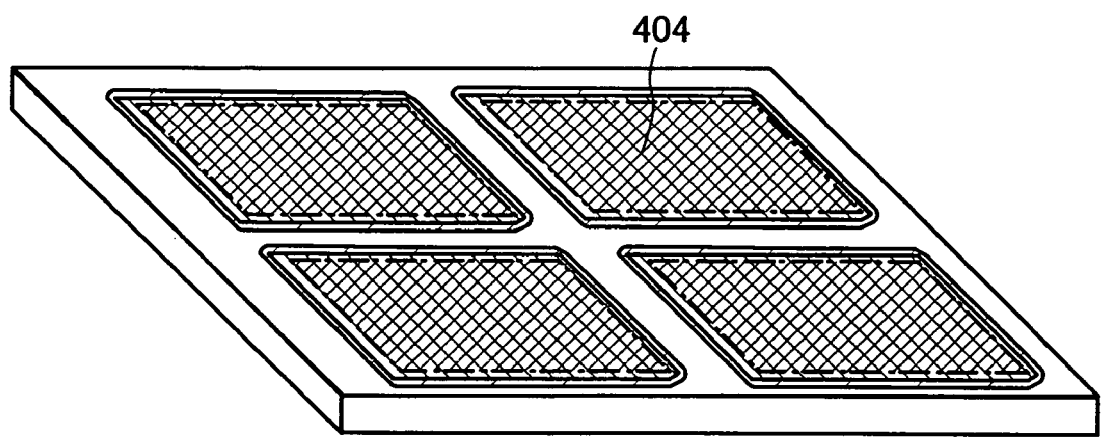

Next, the liquid crystal material 404 is dropped in a region surrounded by the sealant 402 by an inkjet method (see FIG. 14B). As the liquid crystal material 404, a known liquid crystal material having a viscosity by which discharging by an inkjet method is possible may be used. Also, since viscosity of the liquid crystal material 404 can be set by adjusting a temperature, it is suited for the inkjet method. By the inkjet method, a necessary amount of the liquid crystal material 404 can be stored in the region surrounded by the sealant 402 without waste.

Subsequently, the first substrate 400 over which the pixel portion 401 is provided and the second substrate 421 over which the opposing electrode and the orientation film are provided are attached together under reduced pressure so that air bubbles do not enter (see FIG. 15A). Here, ultraviolet irradiation or a heat treatment is performed at the same time as attaching the first substrate 400 and the second substrate 421 together, and the sealant 402 is cured. Note that the heat treatment may be performed in addition to ultraviolet irradiation.

Figure 16A:
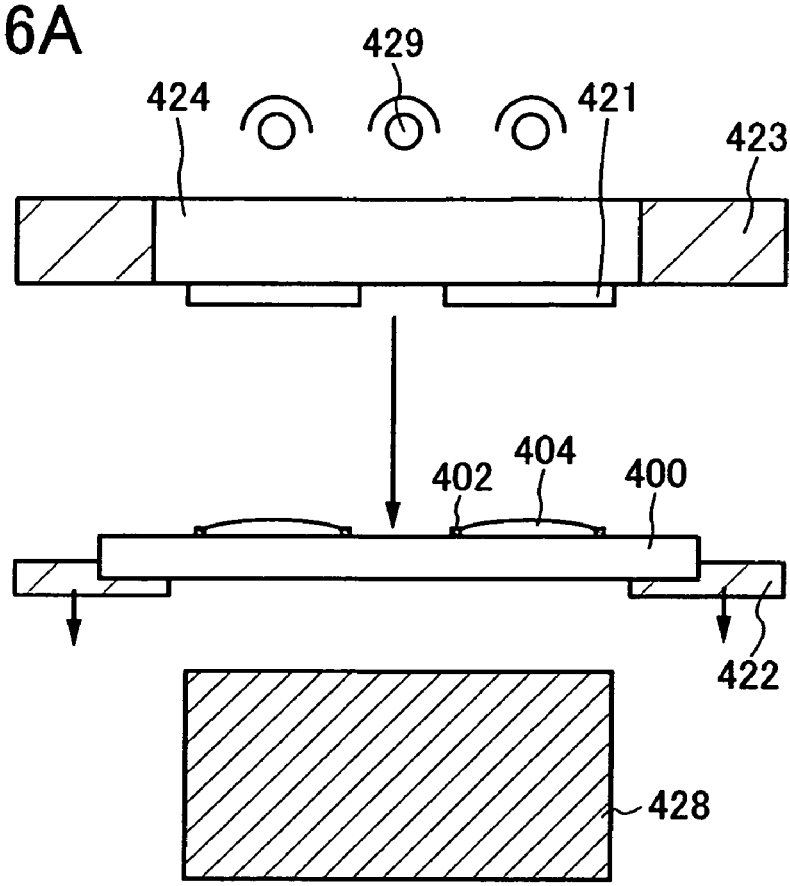
FIGS. 16A and 16B each show a manufacturing step of a liquid crystal display device using a liquid crystal dropping method of the present invention.
Figure 16B:
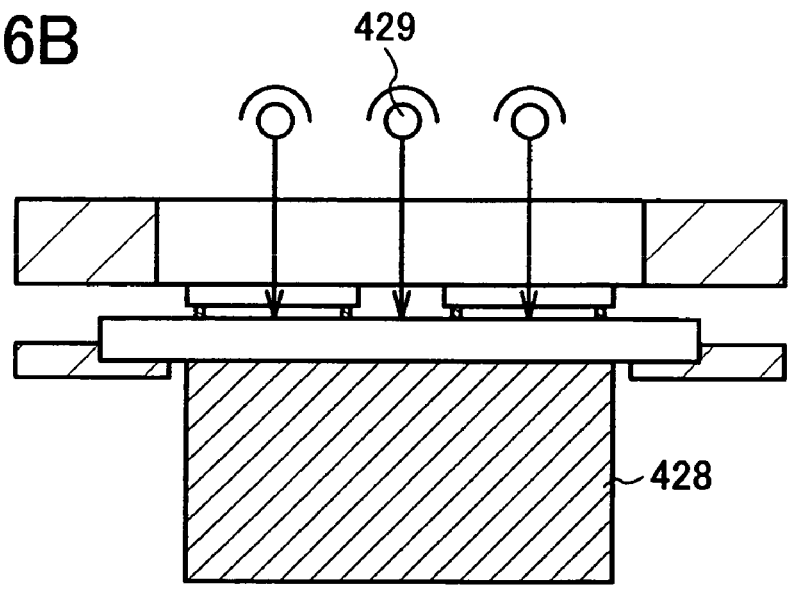
Figure 17A:
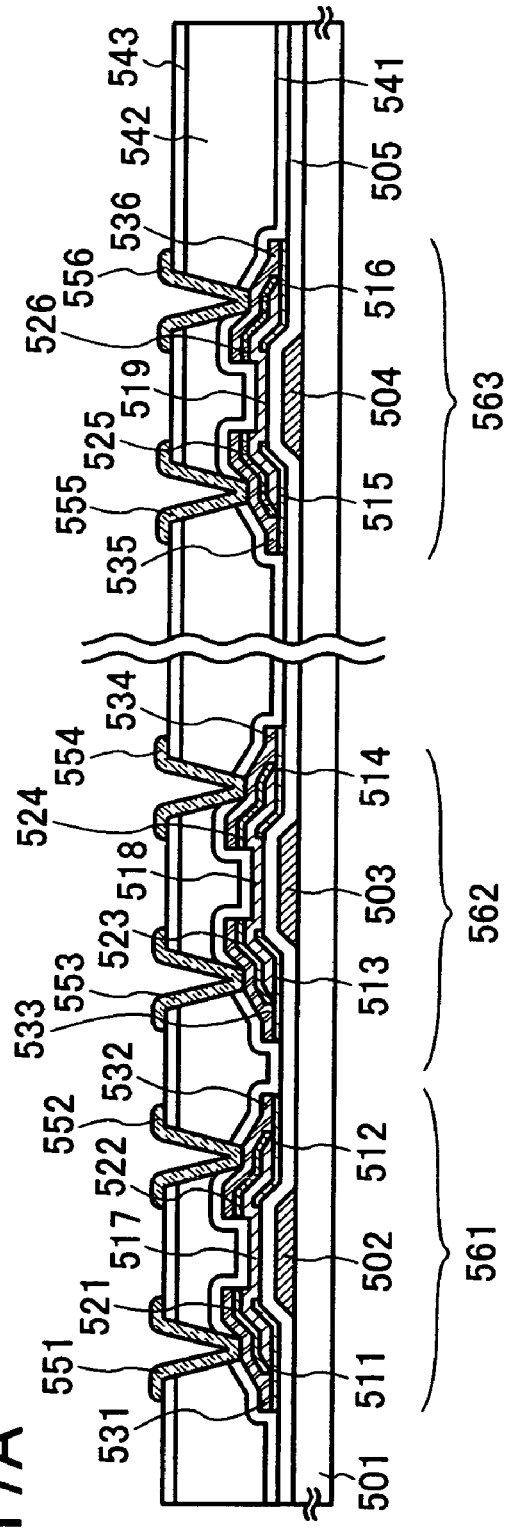
FIGS. 17A and 17B each show a manufacturing step of an EL display device of the present invention.
Figure 17B:
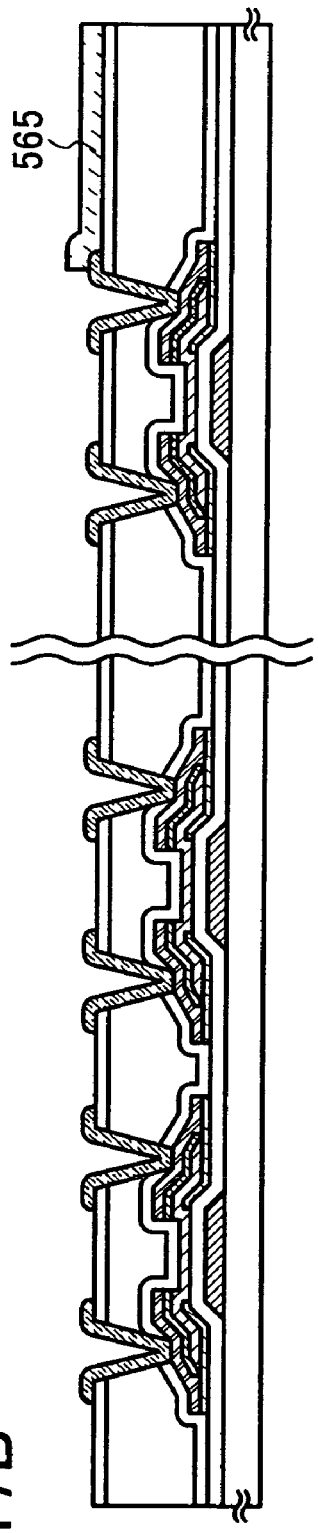
Figure 18:
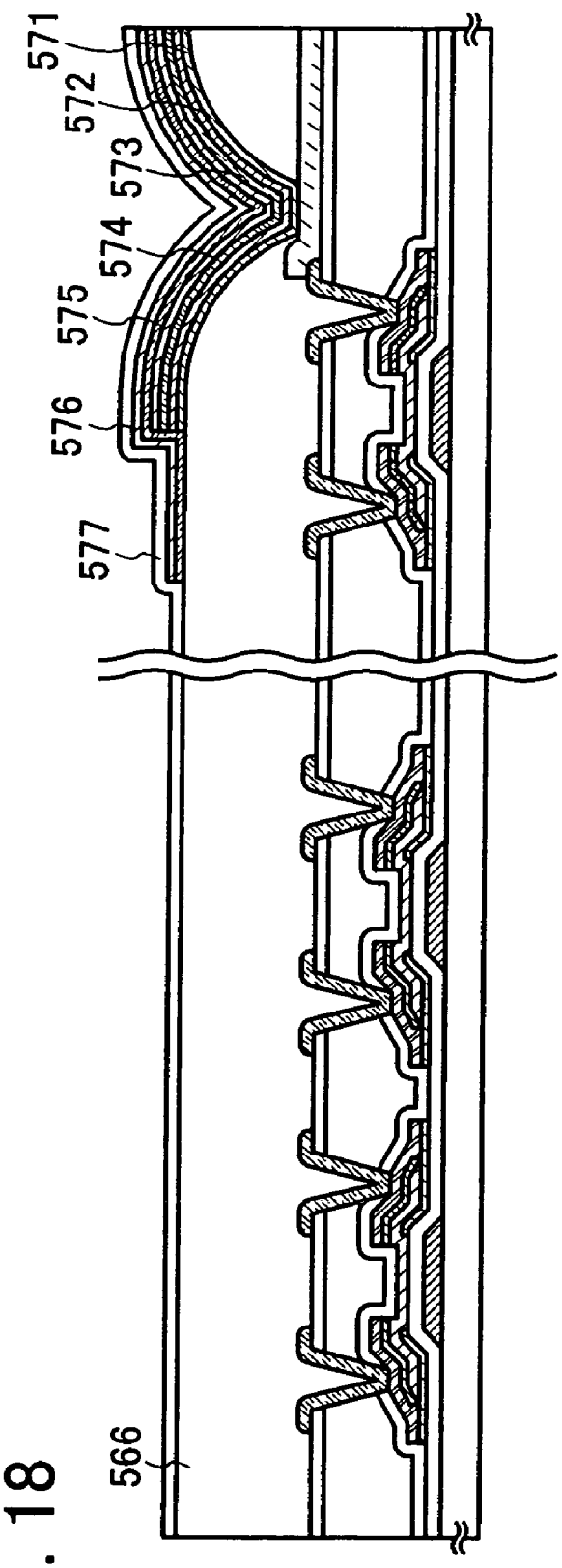
FIG. 18 shows a manufacturing step of an EL display device of the present invention.

Also, FIGS. 16A and 16B each show an example of an attaching apparatus capable of ultraviolet irradiation or heat treatment during or after attaching of substrates.

In FIGS. 16A and 16B, reference numerals 422, 423, 424, 428, and 429 denote a first substrate supporting base, a second substrate supporting base, a light transmitting window, a downside measuring plate, and an ultraviolet light source, respectively. Note that in FIGS. 16A and 16B, the same reference numerals are used for portions corresponding to FIGS. 13A to 15B The downside measuring plate 428 includes a heater, and cures the sealant 402. Also, the second substrate supporting base 423 is provided with the light transmitting window 424 and allows ultraviolet light and the like from the light source 429 to pass through. Although not shown here, a position aligning of a substrate is performed through the window 424. Further, the second substrate 421 serving as an opposing substrate is cut into a desired size in advance, and fixed to the second substrate supporting base 423 by a vacuum chuck or the like. A state before attaching together the first substrate 400 and the second substrate 421 is shown in FIG. 16A.

At the time of attachment, after moving down the first substrate supporting base 422 and the second substrate supporting base 423, the first substrate 400 and the second substrate 421 are attached together by pressure, and then cured by performing ultraviolet irradiation as it is. A state after attaching together the first substrate 400 and the second substrate 421 is shown in FIG. 16B.

Subsequently, the first substrate 400 is cut using a cutting apparatus such as a scriber apparatus, a breaker apparatus, or a roll cutter (see FIG. 15B). In this manner, four panels can be manufactured from one substrate. Then, an FPC is attached using a known technique.

Note that as each of the first substrate 400 and the second substrate 421, a glass substrate or a plastic substrate can be used.

In this manner, in this embodiment, a semiconductor device of the present invention is referred to when manufacturing a liquid crystal display device by a droplet discharging method. A source region and a drain region of the semiconductor device of the present invention each have a structure of being sandwiched from above and below by source or drain electrodes; therefore, contact resistance of the source or drain electrodes and a semiconductor film can be reduced. Also, since there are two layers of the source or drain electrodes, wiring resistance can also be reduced. Further, since first source or drain electrodes that are formed under the semiconductor film can be formed to be thin, coverage of the semiconductor film can be improved to improve TFT characteristics, and reliability of the liquid crystal display device as a whole can also be improved.

Further, this embodiment can be freely combined with the embodiment mode and Embodiments 1 to 5, if necessary.

Embodiment 7

In this embodiment, an example of manufacturing a dual emission display device using the present invention is described with reference to FIGS. 17A to 20.

First, based on the embodiment mode and Embodiments 1 to 4, n-channel TFTs 561 and 562, and a p-channel TFT 563 are formed over a substrate 501.

The n-channel TFT 561 includes a gate electrode 502, a gate insulating film 505, first source or drain electrodes 511 and 512, an island-shaped semiconductor film 517 serving as a channel forming region, island-shaped impurity semiconductor films 521 and 522 each serving as a source region or drain region, and second source or drain electrodes 531 and 532.

The n-channel TFT 562 includes a gate electrode 503, the gate insulating film 505, first source or drain electrodes 513 and 514, an island-shaped semiconductor film 518 serving as a channel forming region, island-shaped impurity semiconductor film 523 and 524 each serving as a source region or drain region, and second source or drain electrodes 533 and 534.

The p-channel TFT 563 includes a gate electrode 504, the gate insulating film 505, first source or drain electrodes 515 and 516, an island-shaped semiconductor film 519 serving as a channel forming region, island-shaped impurity semiconductor films 525 and 526 each serving as a source region or drain region, and second electrode 535 and 536.

As the substrate 501, a similar substrate to the substrate 101 of the embodiment mode and Embodiment 1 may be used. Also, the gate electrodes 502 to 504, the gate insulating film 505, the first source or drain electrodes 511 to 516, the island-shaped semiconductor films 517 to 519, and the second source or drain electrodes 531 to 536 may be formed with reference to the gate electrode 102, the gate insulating film 103, the first source or drain electrodes 104, the island-shaped semiconductor film 105, and the second source or drain electrodes 106 of the embodiment mode and Embodiment 1, respectively.

Also, each of the island-shaped impurity semiconductor films 521 and 522 of the n-channel TFT 561 as well as the island-shaped impurity semiconductor films 523 and 524 of the n-channel TFT 562 may be formed by forming a semiconductor film to which phosphorus (P) or arsenic (As), which is an impurity imparting n-type, is added. On the other hand, each of the island-shaped impurity semiconductor films 525 and 526 of the p-channel TFT 563 may be formed by forming a semiconductor film to which boron (B), which is an impurity imparting p-type, is added.

In this embodiment, the p-channel TFT 563 is used as a pixel TFT of the dual emission display device. Also, the n-channel TFTs 561 and 562 are used as TFTs of a driver circuit that drives the pixel TFT 563. Note that, it is not required that the pixel TFT is a p-channel TFT, and an n-channel TFT may be used. Further, the driver circuit is not required to be a circuit in which a plurality of n-channel TFTs are combined, and it may be a circuit in which an n-channel TFT and a p-channel TFT are combined complementarily, or a circuit in which a plurality of p-channel TFTs are combined.

Next, as a first interlayer insulating film 541, an insulating film containing hydrogen is formed. Subsequently, the impurity elements added to the island semiconductor films are activated. This activation of the impurity elements may be performed by the laser treatment method described in Embodiment 5.

As the insulating film containing hydrogen, a silicon oxide film containing nitrogen obtained by a PCVD method is used. Alternatively, a silicon nitride film containing oxygen is used. Note that the first interlayer insulating film 541 is an insulating film having a light transmitting property and containing silicon oxide.

Subsequently, hydrogenation of the island-shaped semiconductor films is performed by heating at 410° C. for one hour.

Next, a planarization film serving as a second interlayer insulating film 542 is formed. As the planarization film, an inorganic material having a light transmitting property (such as silicon oxide, silicon nitride, or silicon nitride containing oxygen), a photosensitive or non-photosensitive organic material (such as polyimide, acrylic, polyamide, polyimide amide, a resist, or benzocyclobutene), or a stacked layer thereof is used. Further, as another film having a light transmitting property used for the planarization film, an insulating film made of a silicon oxide film containing an alkyl group obtained by a coating method, for example an insulating film formed using silica glass, an alkylsiloxane polymer, an alkylsilsesquioxane polymer, a silsesquioxane hydride polymer, an alkylsilsesquioxane hydride polymer, or the like can be used. As an example of a siloxane-based polymer, PSB-K1 and PSB-K31 which are coating insulating film materials produced by Toray industries Inc. and ZRS-5PH which is a coating insulating film material produced by Catalysts & Chemicals Industries Co., Ltd. are given.

Subsequently, a third interlayer insulating film 543 having a light transmitting property is formed. The third interlayer insulating film 543 is provided as an etching stopper film for protecting the planarization film which is the second interlayer insulating film 542, during a later step in which a conductive film serving as a first pixel electrode 565 is etched. However, if the second interlayer insulating film 542 is to serve as the etching stopper film when the conductive film serving as the first pixel electrode 565 is etched, the third interlayer insulating film 543 is not necessary to be provided.

Next, contact holes are formed through the first interlayer insulating film 541, the second interlayer insulating film 542, and the third interlayer insulating film 543 using a new mask. Subsequently, the mask is removed, and after forming a conductive film (a stacked layer film of a titanium nitride film, an aluminum film, and a titanium nitride film), etching is performed using a different mask (dry etching using a mixed gas of $BCl_3$ and $Cl_2$) to form an electrode or wiring 551, an electrode or wiring 552, an electrode or wiring 553, an electrode or wiring 554, an electrode or wiring 555, and an electrode or wiring 556 (a source wiring or a drain wiring of a TFT, a current supply line, and the like), which are also collectively referred to as electrodes or wirings 551 to 556 (see FIG. 17A). Although an electrode and a wiring are integrally formed in this embodiment, the electrode and the wiring may be separately formed and connected electrically. Note that a titanium nitride film is one of materials having favorable adhesiveness with a high heat resistant planarization film.

Subsequently, the first pixel electrode 565 is formed using a new mask so as to have a thickness in the range of 10 nm to 800 nm. As the first pixel electrode 565, a transparent conductive film having a high work function (work function of 4.0 eV or more) such as a conductive film formed using a target of indium tin oxide containing a Si element, or a target in which 2 to 20 wt % zinc oxide (ZnO) is mixed with indium oxide besides a target of indium tin oxide (ITO) can be used.

Next, an insulator 566 (referred to as a partition or a wall) is formed covering an end portion of the first pixel electrode 565 using a new mask. As the insulator 566, a photosensitive or non-photosensitive organic material obtained by a coating method (polyimide, acrylic, polyamide, polyimide amide, a resist, or benzocyclobutene) or an SOG film (for example, a silicon oxide film containing an alkyl group) is used with a thickness in a range of 0.8 μm to 1 μm.

Subsequently, a hole injecting layer 571, a hole transporting layer 572, a light emitting layer 573, an electron transporting layer 574, and an electron injecting layer 575 are formed using an organic compound by an evaporation method or a coating method.

Note that the hole injecting layer 571, the hole transporting layer 572, the light emitting layer 573, the electron transporting layer 574, and the electron injecting layer 575 are not necessarily formed in this order, and can be formed between the first pixel electrode 565 and a second pixel electrode 576 in the following order: the electron injecting layer, the electron transporting layer, the light emitting layer, the hole transporting layer, and the hole injecting layer from the first pixel electrode 565 side.

Note that in order to improve reliability of a light emitting element, it is preferable to degas by performing vacuum heating before forming the hole injecting layer 571. For example, before performing evaporation of the organic compound material becoming the hole injecting layer, it is preferable to perform a heating treatment in a reduced pressure atmosphere or an inert atmosphere at 200° C. to 300° C. to remove gas included in the substrate. Note that when the interlayer insulating films and the partition are formed using a silicon oxide film having high heat resistance, a heating treatment at a higher temperature (410° C.) can also be performed.

Subsequently, the hole injecting layer (a first layer containing an organic compound) 571 is selectively formed over the first pixel electrode 565 using an evaporation mask by co-evaporating molybdenum oxide (MoOx), 4,4'-bis[N-(1-naphthyl)-N-phenyl-amino]-biphenyl (α-NPD), and rubrene. Note that a material having a high hole injecting property such as copper phthalocyanine (CuPc), vanadium oxide (VOx), ruthenium oxide (RuOx) or tungsten oxide (WOx) can be used besides MoOx. Also, the hole injecting layer 571 may be formed by a coating method using a high molecular compound material having a high hole injecting property such as poly(ethylene dioxythiophene)/poly(styrenesulfonic acid) solution (PEDOT/PSS).

Next, α-NPD is selectively evaporated using an evaporation mask to form the hole transporting layer (a second layer containing an organic compound) 572 over the hole injecting layer 571. Note that an organic compound having a high hole transporting property typified by an aromatic amine compounds such as 4,4'-bis[N-(3-methylphenyl)-N-phenylamino]biphenyl (abbreviation: TPD), 4,4'4"-tris(N,N-diphenyl-amino)-triphenylamine (abbreviation: TDATA), or 4,4', 4"-tris[N-(3-methyl-phenyl)-N-phenyl-amino]-triphenylamine (abbreviation: MTDATA) can be used besides α-NPD.

Subsequently, the light emitting layer (a third layer containing an organic compound) 573 is selectively formed. For a full color display device, an evaporation mask is aligned for each light emitting color (R, G, and B) and then selectively evaporated.

As a light emitting layer 573R emitting red light, a material such as $Alq_3$:DCM or $Alq_3$:rubrene:BisDCJTM is used. Also, as a light emitting layer 573G emitting green light, a material such as $Alq_3$:DMQD (N,N'-dimethylquinacridone) or $Alq_3$: coumarin 6 is used. Further, as a light emitting layer 573B emitting blue light, a material such as α-NPD or tBu-DNA is used.

Next, $Alq_3$ (tris(8-quinolinolato)aluminum) is selectively evaporated using an evaporation mask to form the electron transporting layer (a fourth layer containing an organic compound) 574 over the light emitting layer 573. Also, besides $Alq_3$, an organic compound having a high electron transporting property typified by a metal complex with a quinoline skeleton or a benzoquinoline skeleton such as tris(5-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), or the like can be used. In addition, a metal complex having an oxazole-based or thiazole-based ligand such as bis[2-(2-hydroxyphenyl)-benzoxazolato]zinc (abbreviation: $Zn(BOX)_2$) or bis[2-(2-hydroxyphenyl)-benzothiazolato]zinc (abbreviation: $Zn(BTZ)_2$) can be used. Further, besides the metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like also has a high electron transporting property, and can be used as the electron transporting layer 574.

Next, 4,4-bis(5-methylbenzoxazol-2-yl)stilbene (abbreviation: BzOs) and lithium (Li) are co-evaporated to form the electron injecting layer (a fifth layer containing an organic compound) 575 so as to cover the electron transporting layer 574 and the insulator 566. By using a benzoxazole derivative (BzOs), damage due to the sputtering method during formation of the second pixel electrode 576 performed in a later step is suppressed. Also, besides BxOs:Li, a material having a high electron injecting property such as a compound of an alkali metal or an alkali earth metal, for example $CaF_2$, lithium fluoride (LiF), cesium fluoride (CsF), or the like can be used. In addition, a mixture of $Alq_3$ and magnesium (Mg) can be also used.

Subsequently, the second pixel electrode 576 is formed over the electron injecting layer 575 so as to have a thickness in a range of 10 nm to 800 nm. As the second pixel electrode 576, a conductive film formed using a target of indium tin oxide containing a Si element, or a target in which 2 to 20 wt % zinc oxide (ZnO) is mixed with indium oxide besides a target of indium tin oxide (ITO) can be used.

In the above manner, a light emitting element is manufactured. A material and thickness of each of the first pixel electrode 565, the hole injecting layer 571, the hole transporting layer 572, the light emitting layer 573, the electron transporting layer 574, the electron injecting layer 575, and the second pixel electrode 576 which structure the light emitting element are appropriately selected and set. It is desirable that the same material be used for the first and second pixel electrodes, and that they have about the same film thickness, preferably as thin as about 100 nm.

Also, as described above, the first pixel electrode 565, the electron injecting layer, the electron transporting layer, the light emitting layer, the hole transporting layer, the hole injecting layer, and the second pixel electrode 576 can be stacked in this order if necessary.

Further, if necessary, a transparent protective layer 577 which prevents entry of moisture is formed covering the light emitting element. As the transparent protective layer 577, a silicon nitride film, a silicon oxide film, a silicon nitride film containing oxygen, a silicon oxide film containing nitrogen, a thin film mainly containing carbon (for example a diamond like carbon (DLC) film or a carbon nitride (CN) film), or the like obtained by a sputtering method or a CVD method can be used (see FIG. 18).

Further, a second substrate 581 and the substrate 501 are attached together using a sealant containing a gap material for maintaining space between the substrates. The second substrate 581 may also be formed of a glass substrate or a quartz substrate having a light transmitting property. Note that in the space between the substrates which are a pair, a drying agent as an air gap (inert gas) may be placed, or a transparent sealant (such as an ultraviolet curing or a heat curing epoxy resin) may be filled between the pair of substrates.

Since the first pixel electrode 565 and the second pixel electrode 576 of the light emitting element are formed by a light transmitting material, light can be emitted in two directions, in other words from both sides, of a single light emitting element.

By having a panel structure as described above, intensities of light emission from a top surface and a bottom surface can be about the same.

Figure 19:
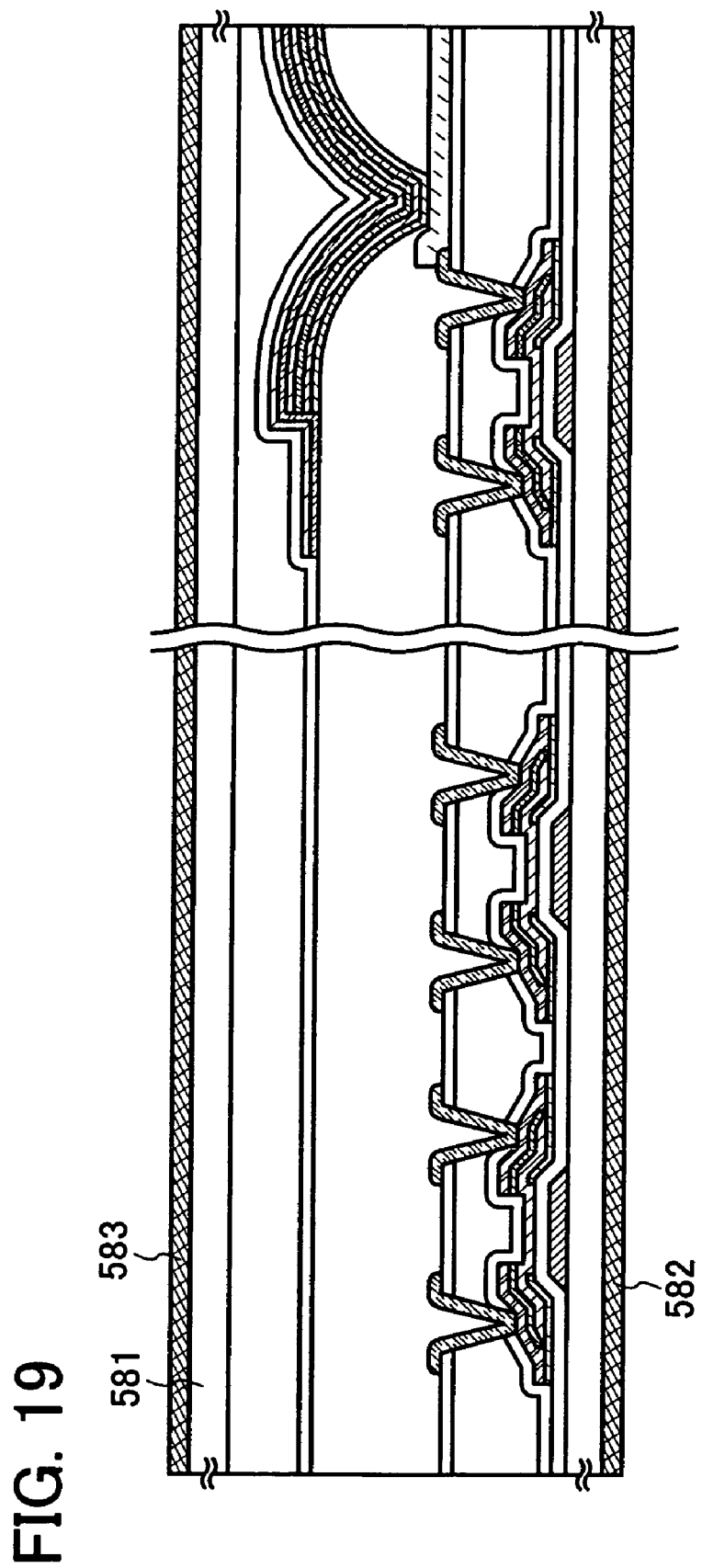
FIG. 19 shows a manufacturing step of an EL display device of the present invention.

Lastly, optical films (a polarizing plate or a circularly polarizing plate) 582 and 583 are provided over the substrates 501 and 581, respectively, to improve contrast (see FIG. 19).

Figure 20:
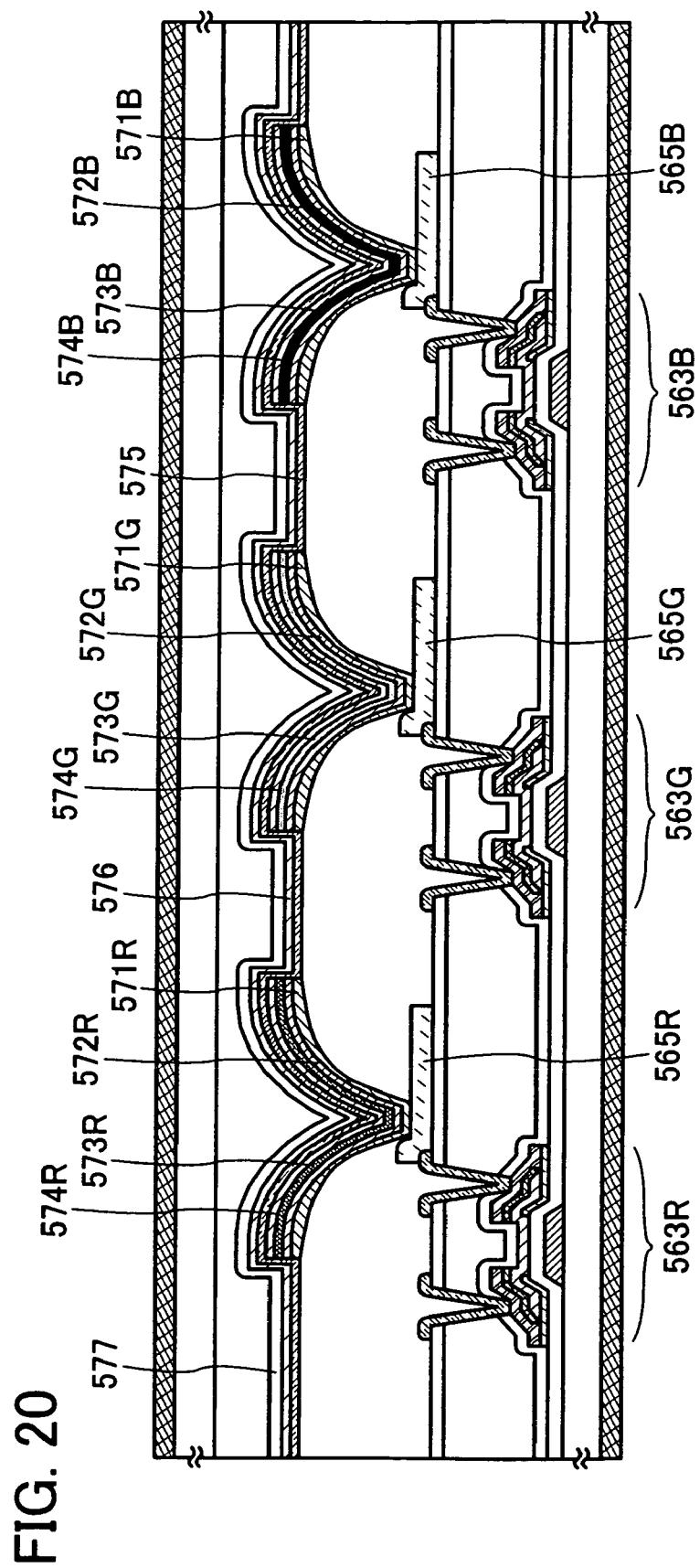
FIG. 20 shows a manufacturing step of an EL display device of the present invention.

FIG. 20 shows a cross-sectional view of a light emitting element for each light emission color (red (R), green (G), blue (B)). A red light emitting element (R) includes a pixel TFT 563R, a first pixel electrode 565R, a hole injecting layer 571R, a hole transporting layer 572R, a light emitting layer 573R, an electron transporting layer 574R, the electron injecting layer 575, the second pixel electrode 576, and the transparent protective layer 577.

Also, a green light emitting element (G) includes a pixel TFT 563G, a first pixel electrode 565G, a hole injecting layer 571G, a hole transporting layer 572G, a light emitting layer 573G, an electron transporting layer 574G, the electron injecting layer 575, the second pixel electrode 576, and the transparent protective film 577.

Further, a blue light emitting element (B) includes a pixel TFT 563B, a first pixel electrode 565B, a hole injecting layer 571B, a hole transporting layer 572B, a light emitting layer 573B, an electron transporting layer 574B, the electron injecting layer 575, the second pixel electrode 576, and the transparent protective layer 577.

In this manner, the source region and the drain region of a semiconductor device of this embodiment each have a structure of being sandwiched from above and below by source or drain electrodes; therefore, contact resistance of the source or drain electrodes and the semiconductor film can be reduced. Also, since there are two layers of the source or drain electrodes, wiring resistance can also be reduced. Further, since the first source or drain electrodes that are formed under the semiconductor film can be formed to be thin, coverage of the semiconductor film can be improved to improve TFT characteristics, and reliability of the dual emission display device as a whole can also be improved.

Further, this embodiment can be freely combined with the embodiment mode and Embodiments 1 to 6, if necessary.

Embodiment 8

As electronic appliances to which the present invention is applied, the following are given: a camera such as a video camera and a digital camera, a goggle display, a navigation system, an audio reproducing device (such as a car audio component), a computer, a game machine, a portable information terminal (such as a mobile computer, a cellular phone, a portable game machine, and an electronic book), an image reproducing device provided with a recording medium (specifically, a device which can reproduce a recording medium such as a digital versatile disc (DVD) and includes a display capable of displaying the image), and the like. Specific examples of these electronic appliances are shown in FIGS. 21A 22D.

Figure 21A:
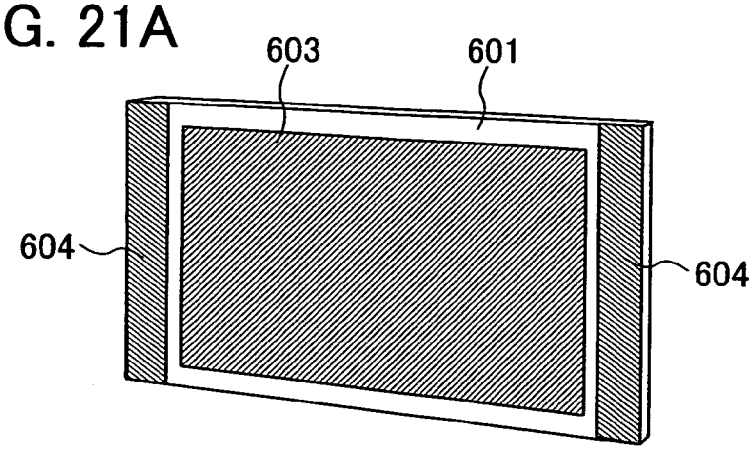
FIGS. 21A to 21D each show an example of an electronic appliance to which the present invention is applied.

FIG. 21A shows a light emitting display device to which a television receiver or the like corresponds. The light emitting display device includes a housing 601, a display portion 603, a speaker portion 604, and the like. The present invention can be applied to the display portion 603, a control circuit portion, and the like. A polarizing plate or a circularly polarizing plate may be provided in a pixel portion in order to improve contrast. For example, a ¼λ plate, a ½λ plate and a polarizing plate may be provided in this order over a sealing substrate. Also, an anti-reflection film may be provided over the polarizing plate. By using the present invention, a light emitting display device with high reliability can be obtained.

Figure 21B:
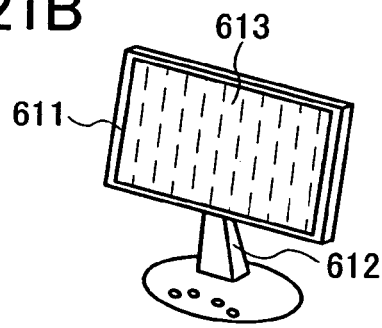

FIG. 21B shows a liquid crystal display or an EL display, and includes a housing 611, a supporting base 612, a display portion 613, and the like. The present invention can be applied to the display portion 613, a control circuit portion, and the like. By using the present invention, a liquid crystal display or an EL display with high reliability can be obtained.

Figure 21C:
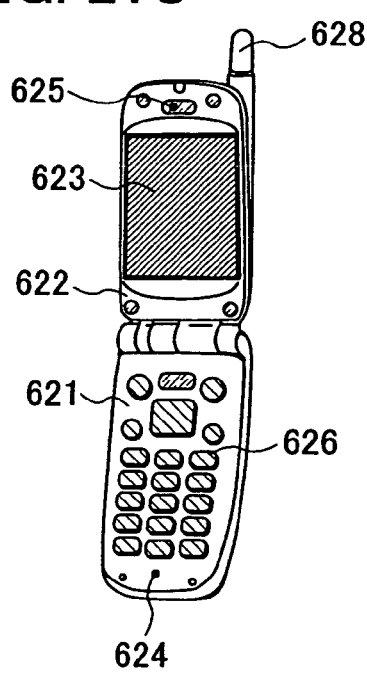

FIG. 21C shows a cellular phone which includes a main body 621, a housing 622, a display portion 623, an audio input portion 624, an audio output portion 625, an operation key 626, an antenna 628, and the like. The present invention can be applied to the display portion 623, a control circuit portion, and the like. By using the present invention, a cellular phone with high reliability can be obtained.

Figure 21D:
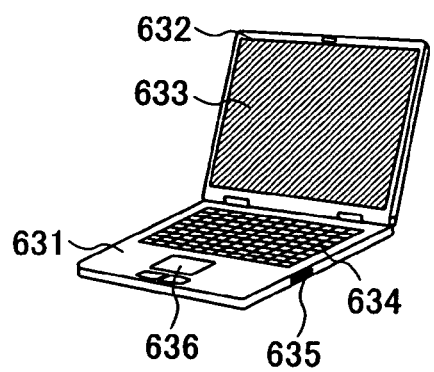

FIG. 21D shows a personal computer which includes a main body 631, a housing 632, a display portion 633, a key board 634, an external connection port 635, a pointing mouse 636, and the like. The present invention can be applied to the display portion 633, a control circuit portion, and the like. By using the present invention, a personal computer with high reliability can be obtained.

Figure 22A:
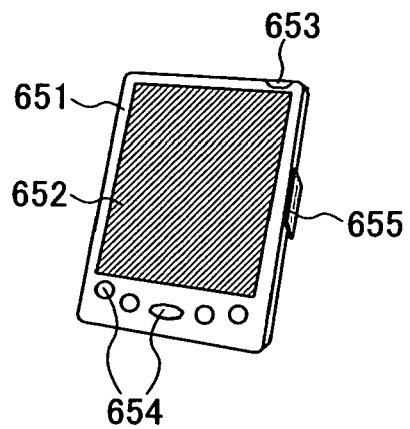
FIGS. 22A to 22D each show an example of an electronic appliance to which the present invention is applied.

FIG. 22A shows a mobile computer which includes a main body 651, a display portion 652, a switch 653, an operation key 654, an infrared port 655, and the like. The present invention can be applied to the display portion 652, a control circuit portion, and the like. By using the present invention, a mobile computer with high reliability can be obtained.

Figure 22B:
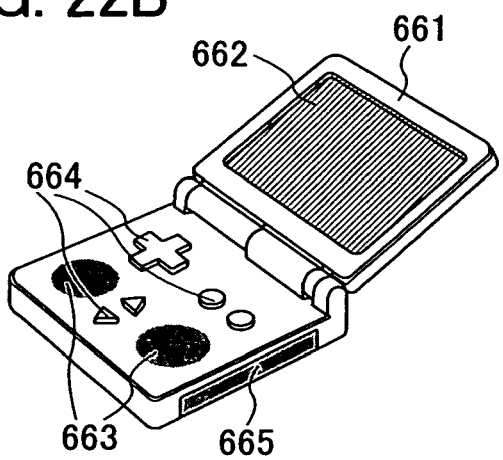

FIG. 22B shows a portable game machine which includes a housing 661, a display portion 662, a speaker portion 663, an operation key 664, a recording medium insertion portion 665, and the like. The present invention can be applied to the display portion 662, a control circuit portion, and the like. By using the present invention, a portable game machine with high reliability can be obtained.

Figure 22C:
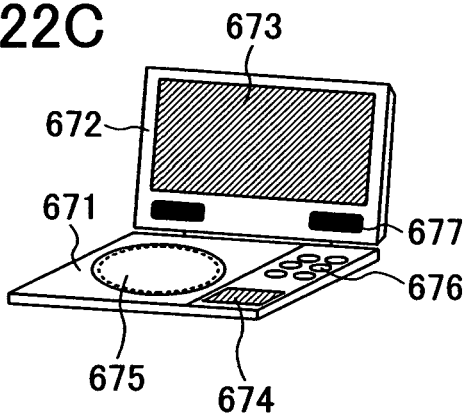
Figure 22D:
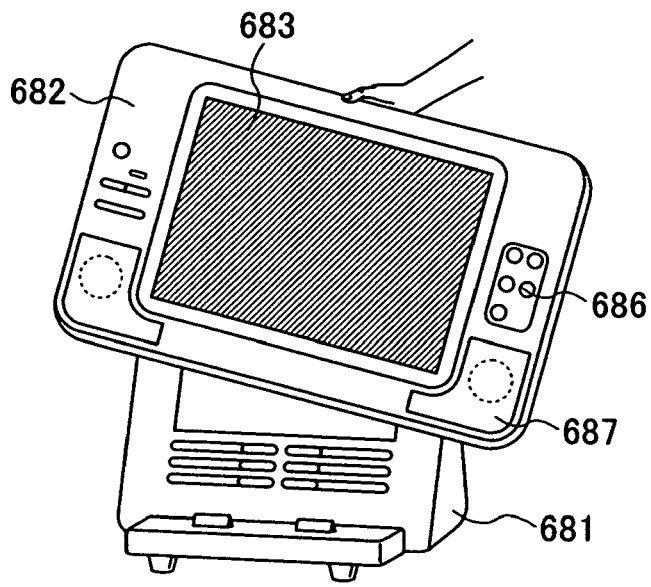

FIG. 22C shows a portable image reproducing device provided with a recording medium (specifically, a DVD reproducing device) which includes a main body 671, a housing 672, a display portion A 673, a display portion B 674, a recording medium reading portion 675 that reads a recording medium such as a DVD, an operation key 676, a speaker portion 677, and the like. The display portion A 673 mainly displays image information, and the display portion B 674 mainly displays textual information. The present invention can be applied to the display portion A 673, the display portion B 674, a control circuit portion, and the like. Note that a home-use game machine and the like are also include in the image reproducing device provided with a recording medium. By using the present invention, an image reproducing device with high reliability can be obtained.

FIG. 22D shows a wireless TV of which just a display can be carried around. A battery and a signal receiver are incorporated in a housing 682, and a display portion 683 and a speaker portion 687 are driven by the battery. The battery can be repeatedly recharged by a recharger 681. Further the recharger 681 can transmit and receive image signals, and transmit the image signals to the signal receiver of a display. The housing 682 is controlled by an operation key 686. Also, the device shown in FIG. 22D can also be called an image sound two-way communication device, since it can transmit signals from the housing 682 to the recharger 681 by operating the operation key 686. In addition, the device shown in FIG. 22D can also be called a general-purpose remote-control device, since communication control of another electronic appliance is possible by operating the operation key 686 and sending signals from the housing 682 to the recharger 681 as well as having the other electronic appliance receive signals that can be transmitted from the recharger 681. The present invention can be applied to the display portion 683, a control circuit portion, and the like. By using the present invention, a TV with high reliability can be obtained.

Note that examples shown in this embodiment are mere examples, and the present invention is not limited to these uses.

In this manner, a source region and a drain region of a semiconductor device of this embodiment have a structure of being sandwiched from above and below by source or drain electrodes; therefore, contact resistance of the source or drain electrodes and a semiconductor film can be reduced. Also, since there are two layers of the source or drain electrodes, wiring resistance can also be reduced. Further, since the first source or drain electrodes that are formed under the semiconductor film can be formed to be thin, coverage of the semiconductor film can be improved to improve TFT characteristics, and reliability of each of the electronic appliances in which a semiconductor device is incorporated can also be improved as a whole.

Further, this embodiment can be applied by being freely combined with the embodiment mode and Embodiments 1 to 7.

INDUSTRIAL APPLICABILITY

By the present invention, a semiconductor device with reduced contact resistance of source or drain electrodes and a semiconductor film can be obtained. This is because a source region and a drain region of the semiconductor device of the present invention have a structure of being sandwiched from above and below by the source or drain electrodes.

Also, since two layers of the source or drain electrodes are formed in the semiconductor device of the present invention by forming one of them above an island-shaped semiconductor film and the other under the island-shaped semiconductor film, wiring resistance can also be reduced.

Further, in the semiconductor device of the present invention, since first source or drain electrodes that are formed under the semiconductor film can be formed to be thin, coverage of the semiconductor film can be improved and TFT characteristics are improved. By the foregoing, reliability of the semiconductor device of the present invention is also improved.

The present application is based on Japanese Priority Application No. 2005-300825 filed on Oct. 14, 2005 with the Japan Patent Office, the entire contents of which are hereby incorporated by reference.

The invention claimed is:

1. A semiconductor device comprising:
a gate electrode over a substrate;
a gate insulating film over the gate electrode;
a first source or drain electrode over the gate insulating film;
an island-shaped semiconductor film including a channel forming region over the first source or drain electrode and the gate insulating film; and
a second source or drain electrode over the island-shaped semiconductor film and the first source or drain electrode,
wherein a part of the second source or drain electrode is formed over and directly in contact with the first source or drain electrode, wherein the island-shaped semiconductor film is sandwiched between the first source or drain electrode and the second source or drain electrode, and wherein edges of the island-shaped semiconductor film are tapered.

2. The semiconductor device according to claim 1, wherein the first source or drain electrode is a titanium film.

3. The semiconductor device according to claim 1, wherein the gate electrode and the first source or drain electrode are formed of a same material.

4. The semiconductor device according to claim 1, wherein the gate electrode, the first source or drain electrode and the second source or drain electrode are formed of a same material.

5. A semiconductor device comprising:
a gate electrode over a substrate;
a gate insulating film over the gate electrode;
a first source or drain electrode over the gate insulating film;
an island-shaped semiconductor film including a channel forming region over the first source or drain electrode and the gate insulating film;
an island-shaped impurity semiconductor film added with an impurity imparting one conductivity type over the island-shaped semiconductor film; and
a second source or drain electrode over the island-shaped semiconductor film, the island-shaped impurity semiconductor film, and the first source or drain electrode,
wherein a part of the second source or drain electrode is formed over and directly in contact with the first source or drain electrode,
wherein the island-shaped semiconductor film and the island-shaped impurity semiconductor film are sandwiched between the first source or drain electrode and the second source or drain electrode, and
wherein edges of the island-shaped semiconductor film are tapered.

6. The semiconductor device according to claim 5, wherein the impurity imparting the one conductivity type is phosphorus or arsenic.

7. The semiconductor device according to claim 5, wherein the impurity imparting the one conductivity type is boron.

8. The semiconductor device according to claim 5, wherein the first source or drain electrode is a titanium film.

9. The semiconductor device according to claim 5, wherein the gate electrode and the first source or drain electrode are formed of a same material.

10. The semiconductor device according to claim 5, wherein the gate electrode, the first source or drain electrode and the second source or drain electrode are formed of a same material.

11. A manufacturing method of a semiconductor device comprising the steps of:
forming a gate electrode over a substrate;
forming a gate insulating film over the gate electrode;
forming first source or drain electrode over the gate insulating film;
forming an island-shaped semiconductor film including a channel forming region over the first source or drain electrode and the gate insulating film; and
forming a second source or drain electrode over the first source or drain electrode and the island-shaped semiconductor film,
wherein a part of the second source or drain electrode is formed over and directly in contact with the first source or drain electrode, wherein the island-shaped semiconductor film is sandwiched between the first source or drain electrode and the second source or drain electrode, and wherein edges of the island-shaped semiconductor film are tapered.

12. The manufacturing method of a semiconductor device according to claim 11, wherein at least one of the gate electrode, the gate insulating film, the first source or drain electrode, the island-shaped semiconductor film, and the second source or drain electrode is formed by an inkjet method.

13. The manufacturing method of a semiconductor device according to claim 11, wherein the first source or drain electrode is a titanium film.

14. The manufacturing method of a semiconductor device according to claim 11, wherein the gate electrode and the first source or drain electrode are formed of a same material.

15. The manufacturing method of a semiconductor device according to claim 11, wherein the gate electrode, the first source or drain electrode and the second source or drain electrode are formed of a same material.

16. A manufacturing method of a semiconductor device comprising the steps of:
forming a first conductive film over a substrate;
forming a gate electrode using the first conductive film;
forming a gate insulating film over the gate electrode;
forming a second conductive film over the gate insulating film;
forming a first source or drain electrode using the second conductive film;
forming a semiconductor film over the first source or drain electrode;
forming an island-shaped semiconductor film including a channel forming region using the semiconductor film;
forming a third conductive film over the first source or drain electrode and the island-shaped semiconductor film; and
forming a second source or drain electrode using the third conductive film,
wherein a part of the second source or drain electrode is formed over and directly in contact with the first source or drain electrode,
wherein the island-shaped semiconductor film is sandwiched between the first source or drain electrode and the second source or drain electrode, and
wherein edges of the island-shaped semiconductor film are tapered.

17. The manufacturing method of a semiconductor device according to claim 16, wherein the first source or drain electrode is a titanium film.

18. The manufacturing method of a semiconductor device according to claim 16, wherein the gate electrode and the first source or drain electrode are formed of a same material.

19. The manufacturing method of a semiconductor device according to claim 16, wherein the gate electrode, the first source or drain electrode and the second source or drain electrode are formed of a same material.

20. A manufacturing method of a semiconductor device comprising the steps of:
forming a gate electrode over a substrate;
forming a gate insulating film over the gate electrode;
forming a first source or drain electrode over the gate insulating film;
forming an island-shaped semiconductor film including a channel forming region over the first source or drain electrode and the gate insulating film;

forming an island-shaped impurity semiconductor film added with an impurity imparting one conductivity type over the island-shaped semiconductor film; and forming a second source or drain electrode over the first source or drain electrode, the island-shaped semiconductor film, and the island-shaped impurity semiconductor film, wherein a part of the second source or drain electrode is formed over and directly in contact with the first source or drain electrode, wherein the island-shaped semiconductor film and the island-shaped impurity semiconductor film are sandwiched between the first source or drain electrode and the second source or drain electrode, wherein edges of the island-shaped semiconductor film are tapered.

21. The manufacturing method of a semiconductor device according to claim 20, wherein the impurity imparting the one conductivity type is phosphorus or arsenic.

22. The semiconductor device according to claim 20, wherein the impurity imparting the one conductivity type is boron.

23. The manufacturing method of a semiconductor device according to claim 20, wherein the first source or drain electrode is a titanium film.

24. The manufacturing method of a semiconductor device according to claim 20, wherein the gate electrode and the first source or drain electrode are formed of a same material.

25. The manufacturing method of a semiconductor device according to claim 20, wherein the gate electrode, the first source or drain electrode and the second source or drain electrode are formed of a same material.

* * * * *

UNITED STATES PATENT AND TRADEMARK OFFICE
CERTIFICATE OF CORRECTION

PATENT NO.       : 7,749,825 B2                                      Page 1 of 1
APPLICATION NO.  : 11/545223
DATED            : July 6, 2010
INVENTOR(S)      : Tatsuya Honda It is certified that error appears in the above-identified patent and that said Letters Patent is hereby corrected as shown below:

In The Claims:

Column 27, Claim 11, Line 57, Change "gale" to --gate--.

Signed and Sealed this
Twenty-second Day of March, 2011

David J. Kappos
*Director of the United States Patent and Trademark Office*